(12) United States Patent
Imafuji et al.

(10) Patent No.: US 7,807,560 B2
(45) Date of Patent: Oct. 5, 2010

(54) SOLDER BUMP FORMING METHOD

(75) Inventors: Kei Imafuji, Nagano (JP); Masao Nakazawa, Nagano (JP); Masaki Sanada, Nagano (JP); Sachiko Oda, Nagano (JP); Tadashi Kodaira, Nagano (JP); Kinji Nagata, Nagano (JP); Masaru Yamazaki, Nagano (JP); Kenjiro Enoki, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 150 days.

(21) Appl. No.: 12/173,985

(22) Filed: Jul. 16, 2008

(65) Prior Publication Data
US 2009/0023281 A1 Jan. 22, 2009

(30) Foreign Application Priority Data

Jul. 17, 2007 (JP) ............................. 2007-186020
May 13, 2008 (JP) ............................. 2008-125761

(51) Int. Cl.
*H01L 21/44* (2006.01)

(52) U.S. Cl. ...................... 438/612; 438/613; 438/687; 257/E21.006; 257/E21.237; 257/E21.242; 257/E21.499; 257/E21.508; 257/E21.509

(58) Field of Classification Search ................ 438/106, 438/113, 460, 612, 613, 637, 678, 675, 687, 438/686; 257/E21.006, 237, 242, 499, 508, 257/509

See application file for complete search history.

(56) References Cited

U.S. PATENT DOCUMENTS

| | | | |
|---|---|---|---|
| 6,217,987 B1 * | 4/2001 | Ono et al. .................... 428/209 |
| 6,365,843 B1 * | 4/2002 | Shirai et al. ................. 174/262 |
| 7,224,056 B2 * | 5/2007 | Burtzlaff et al. ............. 257/704 |
| 7,298,030 B2 * | 11/2007 | McWilliams et al. ........ 257/680 |
| 7,626,829 B2 * | 12/2009 | Watanabe et al. ........... 361/767 |
| 2006/0237225 A1 * | 10/2006 | Kariya et al. ............... 174/260 |

FOREIGN PATENT DOCUMENTS

JP 11-297886 10/1999

* cited by examiner

*Primary Examiner*—David Nhu
(74) *Attorney, Agent, or Firm*—Rankin, Hill & Clark LLP

(57) ABSTRACT

A solder bump forming method of carrying out a reflow treatment over a conductive ball mounted on a plurality of pads, thereby forming a solder bump, includes a metal film forming step of forming a metal film capable of chemically reacting to a tackifying compound on the pads, an organic sticking layer forming step of causing a solution containing the tackifying compound to chemically react to the metal film, thereby forming an organic sticking layer on the metal film, and a conductive ball mounting step of supplying the conductive ball on the pads having the organic sticking layer formed thereon, thereby mounting the conductive ball on the pads through the metal film.

7 Claims, 37 Drawing Sheets

SOLDER BUMP FORMING METHOD

This application claims priority to Japanese application 2007-186020 filed on Jul. 17, 2007 and Japanese application 2008-125761 filed on May 13, 2008.

TECHNICAL FIELD

The present invention relates to a solder bump forming method and more particularly to a solder bump forming method of mounting a conductive ball on each of a plurality of pads provided on a wiring board, a package such as a chip size package or a substrate such as a semiconductor chip, thereby forming the solder bump.

RELATED ART

FIG. 1 is a sectional view showing a related-art substrate.

With reference to FIG. 1, a related-art substrate 10 has a substrate body 11, a through electrode 12, a plurality of pads 13 and 16, solder resists 14 and 17, and a solder bump 19. The following description will be given by taking, as an example of the substrate 10, a wiring board to be used as a semiconductor package.

The through electrode 12 is provided to penetrate the substrate body 11. A lower end of the through electrode 12 is connected to the pad 13 and an upper end of the through electrode 12 is connected to the pad 16. The through electrode 12 serves to electrically connect the pad 13 to the pad 16.

The pads 13 are provided on a lower surface 11A of the substrate body 11. The pads 13 have connecting portions 13A to be external connecting terminals of the substrate 10. The pads 13 are connected to the lower end of the through electrode 12.

The solder resist 14 is provided on the lower surface 11A of the substrate body 11 to cover the pads 13 in parts other than the connecting portion 13A. The solder resist 14 has an opening potion 14A for exposing the connecting portion 13A.

The pads 16 are provided on an upper surface 11B of the substrate body 11. The pads 16 have a bump forming region 16A. the bump forming region 16A is a region where the solder bump 19 is formed and also a region where a flux for temporarily fixing a conductive ball to be the solder bump 19 onto the bump forming region 16A is provided.

The solder resist 17 is provided on the upper surface 11B of the substrate body 11 to cover the pads 16 in parts other than the bump forming region 16A. The solder resist 17 has an opening portion 17A for exposing the bump forming region 16A.

The solder bump 19 is provided in the bump forming regions 16A of the pads 16. The solder bump 19 serves as a connecting terminal of the substrate 10. The solder bump 19 is electrically connected to an electronic component (such as a semiconductor chip), for example.

FIGS. 2 to 7 are views showing a related-art solder bump forming process. In FIGS. 2 to 7, the same components as those of the related-art substrate 10 shown in FIG. 1 have the same reference numerals.

With reference to FIGS. 2 to 7, description will be given to a related-art solder bump forming method. First of all, at a step shown in FIG. 2, there is prepared a base material 21 having a plurality of substrate forming regions J in which a substrate 10 is to be formed, and a through electrode 12, a plurality of pads 13 and 16, and solder resists 14 and 17 are formed on the base material 21 by a well-known method. The base material 21 is cut along a cutting position K at the step shown in FIG. 7 which will be described below and is thus changed into the substrate body 11 shown in FIG. 1.

At a step shown in FIG. 3, next, a flux 23 is formed to cover bump forming regions 16A of the pads 16. More specifically, as shown in FIG. 37, a flux forming mask 23A is disposed on the solder resist 17 in a state that an opening portion 23B of the flux forming mask 23A is aligned with the opening portion 17A of the solder resist 17. The flux is applied to the bump forming region 16A via the flux forming mask 23A by using a device for applying the flux (not shown)

At a step shown in FIG. 4, subsequently, a structure shown in FIG. 3 is fixed onto a stage 25 of a conductive ball mounting device 24, and furthermore, a conductive ball mounting mask 26 has a plurality of conductive ball mounting holes 26A (holes for mounting conductive balls 28 on the bump forming regions 16A of the pads 16 respectively) are disposed above the structure shown in FIG. 3. Then, the conductive balls 28 are supplied from above the conductive ball mounting mask 26, and the conductive ball mounting mask 26 and the stage 25 are oscillated so that the conductive ball 28 is mounted on each of the bump forming regions 16A of the pads 16 in which the flux 23 is formed.

At a step shown in FIG. 5, then, the structure shown in FIG. 4 is removed from the stage 25 of the conductive ball mounting device 24. At a step shown in FIG. 6, thereafter, the conductive ball 28 shown in FIG. 5 is subjected to a reflow treatment so that a solder bump 19 is formed on the bump forming regions 16A of the pads 16.

At a step shown in FIG. 7, thereafter, the structure shown in FIG. 6 is cut along the cutting position K. Consequently, the substrates 10 are manufactured (for example, see Patent Document 1).

[Patent Document 1] Japanese Patent Application Publication No. 11-297886

However, in the process for forming the flux in FIG. 37, there is a problem in that a relative misalignment of the opening portion 23B of the flux forming mask 23A and the opening portion 17A of the solder resist 17 is generated and the flux which is not applied to the bump forming region 16A or the flux which is applied on the surface of the solder resist 17 is formed. In this case, the pad 16 having no conductive ball 28 mounted thereon is generated. Further, there is a problem in that the conductive ball 28 is mounted on parts other than the pad 16, and then it is melt and flow out at reflow treatment, thereby causing a problem such as a short between the adjacent solder balls.

Even if the opening portion 23B of the flux forming mask 23A and the opening portion 17A of the solder resist 17 are aligned properly, the viscosity of the flux is low and thus, the flux is leak out to a gap between the flux forming mask 23A and the solder resist 17 and a gap between the solder resist 17 the base material 21. Therefore, there is a problem in that a part of the flux is adhered to the surface of the solder resist 17 and an area where the flux is applied becomes large, and thus, there is a possibility that the plurality of conductive balls is mounted on one pad.

Further, in the process for manufacturing the substrate 10, a variation is generated in the positions or sizes of the pad 16 and the opening portions of the solder resist 17 (the opening portion for exposing the bump forming region 16A) over the substrate body 11 for each substrate 10 which is manufactured.

On the other hand, the conductive ball mounting holes 26A provided on the conductive ball mounting masks 26 are formed in almost designed positions.

FIG. 8 is a view for explaining problems of the related-art solder bump forming method.

In the case in which the conductive balls 28 are mounted on the pads 16 by using the conductive ball mounting mask 26 as in the related-art solder bump forming method, therefore, there is a problem in that a relative misalignment of the conductive ball mounting hole 26A from the bump forming region 16A is generated and the pad 16 having no conductive ball 28 mounted thereon is generated as shown in FIG. 8. The problem is more remarkable with an increase in a fineness of the pad 16 or the conductive ball 28.

Moreover, the related-art solder bump forming method has a problem in that a manufacturing cost of the substrate 10 is increased because the conductive ball mounting mask 26 is used.

SUMMARY

Exemplary embodiments of the present invention provide a solder bump forming method capable of reducing a manufacturing cost and reliably mounting a conductive ball on each of pads.

An aspect of the invention is directed to a solder bump forming method of carrying out a reflow treatment over a conductive ball mounted on a plurality of pads, thereby forming a solder bump, comprising a metal film forming step of forming a metal film capable of chemically reacting to a tackifying compound on the pads, an organic sticking layer forming step of causing a solution containing the tackifying compound to chemically react to the metal film, thereby forming an organic sticking layer on the metal film, and a conductive ball mounting step of supplying the conductive ball on the organic sticking layer, thereby mounting the conductive ball on the pads through the organic sticking layer and the metal film.

According to the invention, the metal film capable of chemically reacting to the tackifying compound is formed on the pads and the solution containing the tackifying compound is then caused to chemically react to the metal film to form the organic sticking layer on the metal film. Also in the case in which the metal film in a part in which the organic sticking layer is formed has a small area, consequently, it is possible to form an organic sticking layer having an almost equal thickness on the metal film. When mounting the conductive ball on the pads, consequently, it is possible to reliably mount one of the conductive balls on each of the pads through the organic sticking layer and the metal film without using a conductive ball mounting mask which has been required in the related art. Since the conductive ball mounting mask is not required, moreover, it is possible to reduce a manufacturing cost of a structure in which the pads are formed.

Moreover, the tackifying compound may contain at least one of a naphthotriazole based derivative, a benzotriazole based derivative, an imidazole based derivative, a benzoimidazole based derivative, a mercaptobenzothiazole based derivative and a benzothiazolethio fatty acid based derivative. By using the tackifying compound, it is possible to form an organic sticking layer for temporarily fixing the conductive ball on the metal film.

Furthermore, a Cu film or an Ni film may be used for the metal film. Consequently, it is possible to cause the metal film to chemically react to the tackifying compound.

When the Ni film is used as the metal film, moreover, it is also possible to provide an Au layer forming step of forming an Au layer on the metal film, and an Au layer removing step of removing the Au layer immediately before the organic sticking layer forming step between the metal film forming step and the organic sticking layer forming step. In the case in which the Ni film which is apt to be oxidized is used as the metal film, thus, it is possible to prevent the oxidation of the Ni film by forming the Au layer on the metal film.

In addition, at the conductive ball mounting step, it is also possible to distribute the conductive balls over the pads having the organic sticking layer formed thereon and to oscillate or rock the pads, thereby mounting one of the conductive balls on each of the pads. Consequently, it is possible to mount one of the conductive balls on each of the pads.

Furthermore, it is also possible to provide a diffusion preventing film forming step of forming a diffusion preventing film on the pads before the metal film forming step and to form the metal film on the diffusion preventing film. By forming the diffusion preventing film on the pads, thus, it is possible to prevent Cu contained in the pads from being diffused into a solder bump when using Cu as a material of the pads.

In addition, the diffusion preventing film may be constituted by at least one of an Ni film, a Pd film and an Au film which are formed by a plating method. Consequently, it is possible to prevent Cu contained in the pads from being diffused into a solder bump.

According to the invention, the metal film formed on the pad is caused to carry out the chemical reaction, thereby forming the organic sticking layer for temporarily fixing the conductive ball. Therefore, it is possible to accurately dispose the fine conductive ball without using the conductive ball mounting mask. Therefore, it is possible to reduce a manufacturing cost, and furthermore, to reliably mount a conductive ball on each of the pads.

Other features and advantages may be apparent from the following detailed description, the accompanying drawings and the claims.

DETAILED DESCRIPTION

Next, an embodiment according to the invention will be described with reference to the drawings.

First Embodiment

Figure 9:
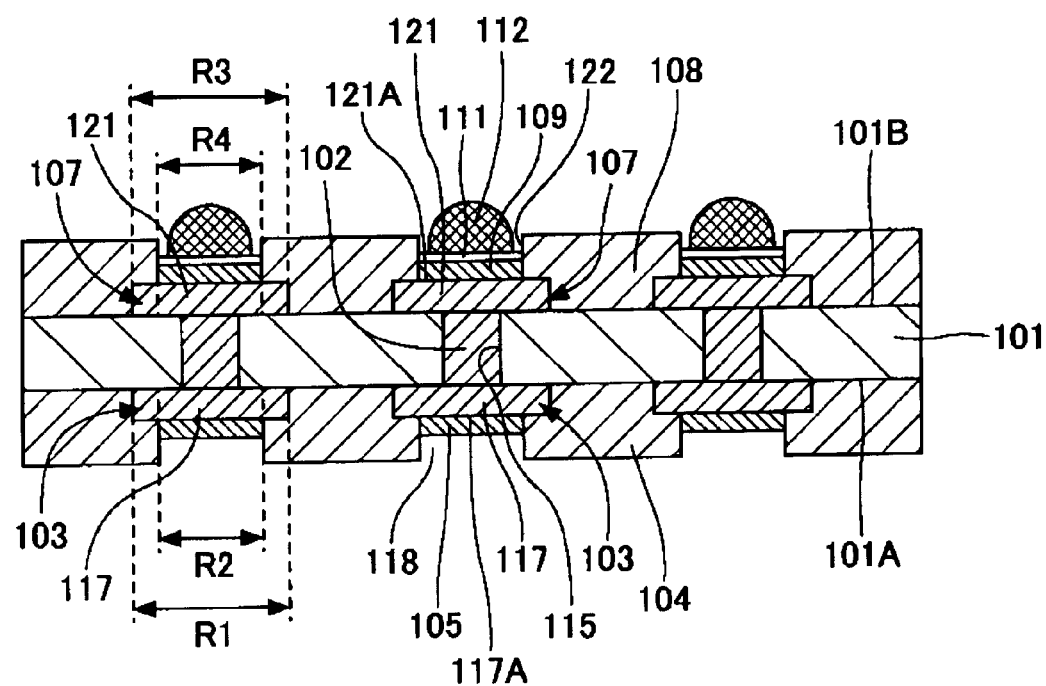
FIG. 9 is a sectional view showing a substrate according to a first embodiment of the invention.

FIG. 9 is a sectional view showing a substrate according to a first embodiment of the invention.

With reference to FIG. 9, a substrate 100 according to the embodiment has a substrate body 101, a through electrode 102, a plurality of pads 103 and 107, solder resists 104 and 108, diffusion preventing films 105 and 109, a metal film 111, and a solder bump 112. In the embodiment, the following description will be given by taking, as an example of the substrate 100, a wiring board to be used as a semiconductor package.

The substrate body 101 takes a shape of a plate and has a plurality of through holes 115. The through electrode 102 is provided in the through holes 115. A lower end of the through electrode 102 is connected to the pad 103 and an upper end of the through electrode 102 is connected to the pad 107. The through electrode 102 serves to electrically connect the pad 103 to the pad 107. For the through electrode 102, it is possible to use a Cu plated film formed by a plating method, for example.

The pads 103 are provided on a lower surface 101A of the substrate body 101 in a corresponding part to a position in which the lower end of the through electrode 102 is to be formed. The pads 103 take a circular shape seen on a plane and have a connecting portion 117 on which the diffusion preventing film 105 is to be formed. The connecting portion 117 is electrically connected to a mounting substrate (not shown) such as a mother board through the diffusion preventing film 105, for example. The connecting portion 117 takes a circular shape seen on a plane. For the pads 103, it is possible to use a Cu film which is patterned, for example. A thickness of the pads 103 can be set to be 15 μm, for example. The pads 103 can be set to have a diameter R1 of 120 μm, for example. In this case, the connecting portion 117 can be set to have a diameter R2 of 80 μm, for example. The planar shapes of the pad 103 and the connecting portion 117 are not restricted to shapes in the embodiment. The planar shapes of the pad 103 and the connecting portion 117 may be set to be a rectangle, a polygon or other shapes, for example.

The solder resist 104 is provided on the lower surface 101A of the substrate body 101 to cover the pads 103 in parts other than the connecting portion 117. The solder resist 104 has an opening portion 118 for exposing a surface 117A of the connecting portion 117.

The diffusion preventing film 105 is provided to cover the connecting portion 117 in an exposed part to the opening portion 118. For the diffusion preventing film 105, it is possible to use an Ni/Au laminated film having an Ni layer and an Au layer laminated on the surface 117A of the connecting portion 117 in order, an Ni/Pd/Au laminated film having an Ni layer, a Pd layer and an Au layer laminated on the surface 117A of the connecting portion 117 in order, a Pd/Au laminated film having a Pd layer and an Au layer laminated on the surface 117A of the connecting portion 117 in order, and an Au layer formed on the surface 117A of the connecting portion 117, for example. In the case in which the Ni/Pd/Au laminated film is used as the diffusion preventing film 105, an Ni layer (for example, a thickness of 3 μm or more), a Pd layer (for example, a thickness of 0.1 μm or less) and an Au layer (for example, a thickness of 0.01 μm to 0.5 μm) are sequentially laminated by an electroless plating method to form the Ni/Pd/Au laminated film, for example.

The pads 107 are provided on the upper surface 101B of the substrate body 101 in a corresponding part to a position in which the upper end of the through electrode 102 is to be formed. The pads 107 take a circular shape seen on a plane and have a connecting portion 121 on which the diffusion preventing film 109 is to be formed. The connecting portion 121 is electrically connected to the solder bump 112 through the diffusion preventing film 109 and the metal film 111. The connecting portion 121 takes a circular shape seen on a plane. For the pads 107, it is possible to use a Cu film which is patterned, for example. A thickness of the pads 107 can be set to be 15 μm, for example. In the case in which the conductive ball to be the solder bump 112 has a diameter of 90 μm, the pads 107 can be set to have a radius R3 of 120 μm, for example. In this case, moreover, the connecting portion 121 can be set to have a diameter R4 of 80 μm, for example. The planar shapes of the pad 107 and the connecting portion 121 are not restricted to shapes in the embodiment. The planar shapes of the pad 107 and the connecting portion 121 may be set to be a rectangle, a polygon or other shapes, for example.

The solder resist 108 is provided on the upper surface 101B of the substrate body 101 to cover the pads 107 in parts other than the connecting portion 121. The solder resist 108 has an opening portion 122 for exposing a surface 121A of the connecting portion 121 in the pad 107. The opening portion 122 takes a cylindrical shape. The opening portion 122 can be set to have such a diameter that only one conductive ball can be mounted thereon. In the case in which the conductive ball to be the solder bump 112 has a diameter of 90 μm, the opening portion 122 can be set to have a diameter of 80 μm, for example. The shape of the opening portion 122 is not restricted to the shape in the embodiment. The planar shape of the opening portion 122 may be set to be a rectangle, a polygon or other shapes.

The diffusion preventing film 109 is provided to cover the surface 121A of the connecting portion 121 exposed to the opening portion 122. The diffusion preventing film 109 serves to prevent a metal component forming the pad 107 from being diffused into the solder bump 112 and to enhance a bonding property of the solder and the pad 107. The diffusion preventing film 109 is particularly effective for the case in which the metal films 111 and 151 have small thicknesses and are diffused perfectly into the solder in the reflow of the conductive ball.

For the diffusion preventing film 109, it is possible to use an Ni/Au laminated film having an Ni layer and an Au layer laminated on the surface 121A of the connecting portion 121 exposed to the opening portion 122 in order, an Ni/Pd/Au laminated film having an Ni layer, a Pd layer and an Au layer laminated on the surface 121A of the connecting portion 121 in order, a Pd/Au laminated film having a Pd layer and an Au layer laminated on the surface 121A of the connecting portion 121 in order, and an Au layer formed on the surface 121A of the connecting portion 121, for example. In the case in which the Ni/Pd/Au laminated film is used as the diffusion preventing film 109, an Ni layer (for example, a thickness of 3 μm or more), a Pd layer (for example, a thickness of 0.1 μm or less) and an Au layer (for example, a thickness of 0.01 μm to 0.5 μm) are sequentially laminated by the electroless plating method to form the Ni/Pd/Au laminated film, for example.

The metal film 111 is provided to cover a surface of the diffusion preventing film 109 at an opposite side to a surface provided in contact with the pad 107. The metal film 111 can chemically react to a tackifying compound containing at least one of a naphthotriazole based derivative, a benzotriazole based derivative, an imidazole based derivative, a benzoimidazole based derivative, a mercaptobenzothiazole based derivative and a benzothiazolethio fatty acid based derivative. The metal film 111 serves to form an organic sticking layer for temporarily fixing, onto the metal film 111, a conductive ball (which is changed into the solder bump 112 by carrying out the reflow treatment over the conductive ball) which will be described below through a reaction to a solution containing the tackifying compound.

For the metal film 111, it is possible to use a Cu film or an Ni film, for example. In the case in which the Cu film is used as the metal film 111, a thickness of the Cu film can be set to be 0.1 μm to 1.0 μm, for example. The metal film 111 can be formed by a plating method, for example.

The solder bump 112 is provided on the surface of the metal film 111 at the opposite side to the surface provided in contact with the diffusion preventing film 109. The solder bump 112 is electrically connected to an electronic component (not shown) such as a semiconductor chip.

For the substrate 100 having the structure described above (the structure of the pad of the substrate), it is possible to use a wiring board, a package such as a chip size package, or a semiconductor chip, for example.

Referring to the substrate 100 according to the embodiment, the description has been given by taking, as an example, the case in which the metal film 111 provided on the diffusion preventing film 109 has a great thickness (which is equal to or greater than 0.5 μm, for example. The case in which only a part of the metal film 111 is diffused into the solder when the solder bump 112 is to be formed). In the case in which the metal film 111 has a small thickness (which is smaller than 0.5 μm, for example), the whole metal film 111 is diffused into the solder in the reflow treatment for the conductive ball 129 at a step shown in FIG. 19 which will be described below. Therefore, the metal film 111 is not left after the solder bump 112 is formed.

Figure 10:
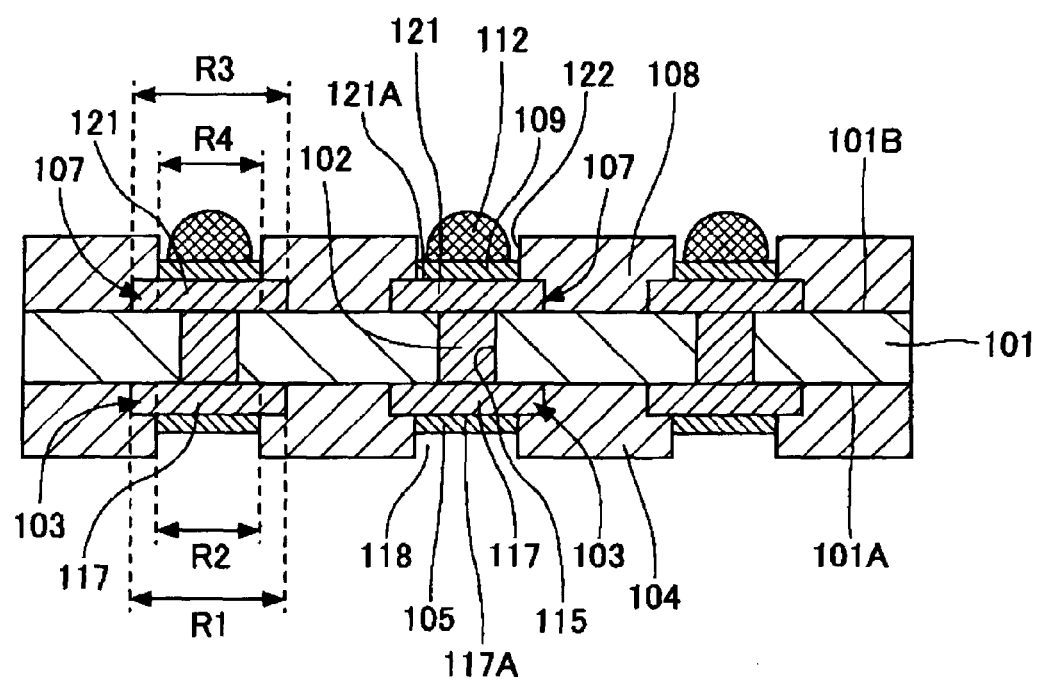
FIG. 10 is a sectional view showing a substrate according to a variant of the first embodiment of the invention.

In other words, as shown in FIG. 10 which will be described below, the metal film 111 covering the diffusion preventing film 109 is not present on a substrate 123 which is a finished member.

FIG. 10 is a sectional view showing a substrate according to a variant of the first embodiment of the invention. In FIG. 10, the same components as those in the substrate 100 according to the first embodiment have the same reference numerals.

With reference to FIG. 10, the substrate 123 according to the variant of the first embodiment has the same structure as that of the substrate 100 except that the whole metal film 111 provided in the substrate 100 according to the first embodiment is diffused into the solder bump 112.

FIGS. 11 to 20 are views showing a solder bump forming process according to the first embodiment of the invention. In FIGS. 11 to 20, the same components as those of the substrate 100 according to the first embodiment have the same reference numerals.

With reference to FIGS. 11 to 20, the solder bump forming method according to the embodiment will be described by taking, as an example, the case in which the substrate 100 according to the first embodiment is manufactured.

Figure 11:
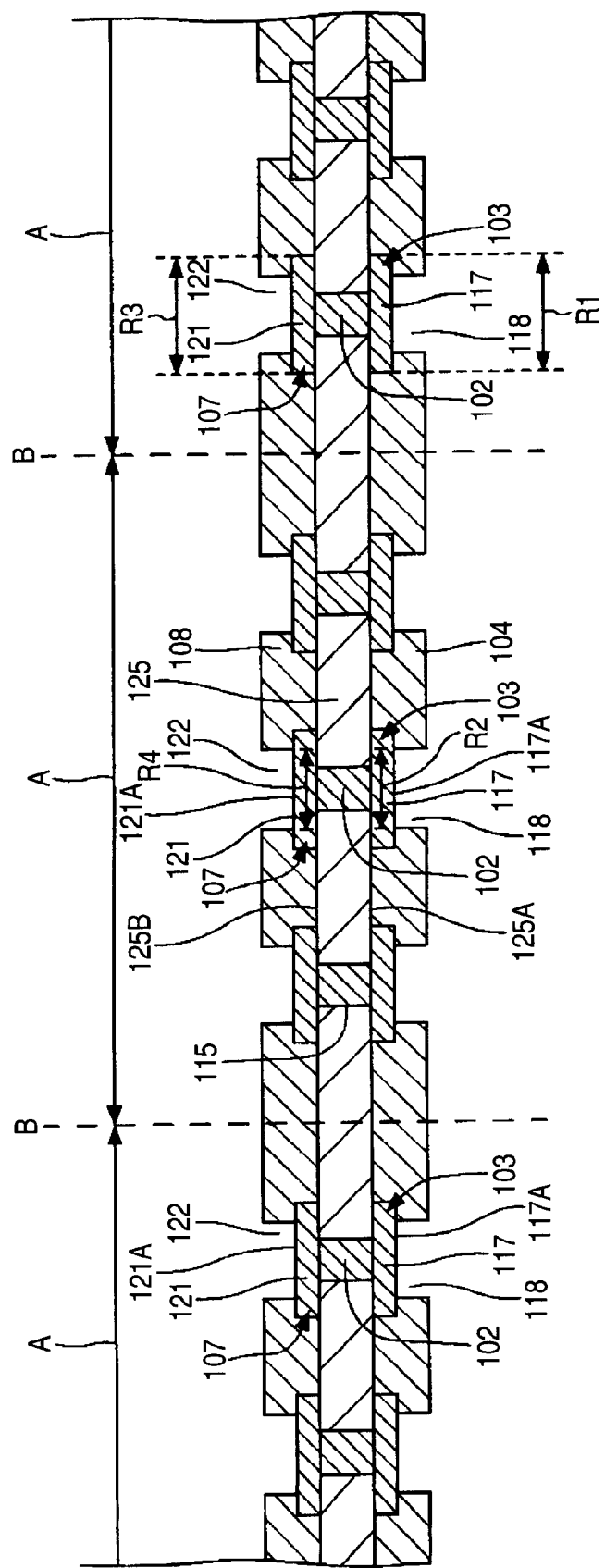
FIG. 11 is a view (No. 1) showing a solder bump forming step according to the first embodiment of the invention.

First of all, at a step shown in FIG. 11, a through hole 115, a through electrode 102 and a plurality of pads 103 and 107 are formed, by a well-known method, on a base material 125 having a plurality of substrate forming regions A in which the substrate 100 is to be formed, and then, a solder resist 104 having an opening portion 118 exposing a surface 117A of a connecting portion 117 is formed on a surface 125A of the base material 125 and a solder resist 108 having an opening portion 122 exposing a surface 121A of a connecting portion 121 is formed on a surface 125B (at an opposite side to the surface 125A) of the base material 125.

The base material 125 is cut in a cutting position B so that a plurality of substrate bodies 101 is obtained. For the base material 125, it is possible to use a silicon substrate or a glass epoxy substrate, for example. The through electrode 102, the pads 103 having the connecting portion 117, and the pads 107 having the connecting portion 121 are formed by a plating method, for example. For the through electrode 102 and the pads 103 and 107, it is possible to use a Cu film, for example. The pads 103 and 107 can be set to have a thickness of 15 μm, for example. A diameter R1 of the pads 103 can be set to be 120 μm, for example. In this case, the connecting portion 117 can be set to have a diameter R2 of 80 μm, for example. In the case in which a conductive ball 129 to be used at a step shown in FIG. 16 which will be described below has a diameter of 90 μm, moreover, a diameter R3 of the pads 107 can be set to be 120 μm, for example. In this case, a diameter R4 of the connecting portion 121 can be set to be 80 μm, for example.

The opening portion 118 is formed in such a manner that a diameter thereof is almost equal to the diameter R2 of the connecting portion 117. Furthermore, the opening portion 122 can be formed in such a manner that a diameter thereof is almost equal to the diameter R4 of the connecting portion 121, for example.

At a step shown in FIG. 12, subsequently, the connecting portions 117 and 121 are subjected to a washing treatment and an activating treatment and a diffusion preventing film 105 is then formed on the surface 117A of the connecting portion 117 by a plating method, and furthermore, a diffusion preventing film 109 is formed on the surface 121A of the connecting portion 121 (a diffusion preventing film forming step). The washing and activating treatments include a degreasing treatment for the surfaces 117A and 121A of the connecting portions 117 and 121, an etching treatment for the surfaces 117A and 121A of the connecting portions 117 and 121 subjected to the degreasing treatment, an acid washing treatment for the surfaces 117A and 121A of the connecting portions 117 and 121 subjected to the etching treatment, and the activating treatment for the surfaces 117A and 121A of the connecting portions 117 and 121 subjected to the acid washing treatment, for example.

For the diffusion preventing films 105 and 109, for example, it is possible to use an Ni/Au laminated film having an Ni layer and an Au layer laminated in order, an Ni/Pd/Au laminated film having an Ni layer, a Pd layer and an Au layer laminated in order, a Pd/Au laminated film having a Pd layer and an Au layer laminated in order, and an Au layer. In the case in which the Ni/Pd/Au laminated film is used as the diffusion preventing films 105 and 109, an Ni layer (for example, a thickness of 3 $\mu$m or more), a Pd layer (for example, a thickness of 0.1 $\mu$m or less) and an Au layer (for example, a thickness of 0.01 $\mu$m to 0.5 $\mu$m) are sequentially laminated by an electroless plating method to form the Ni/Pd/Au laminated film, for example.

Figure 13:
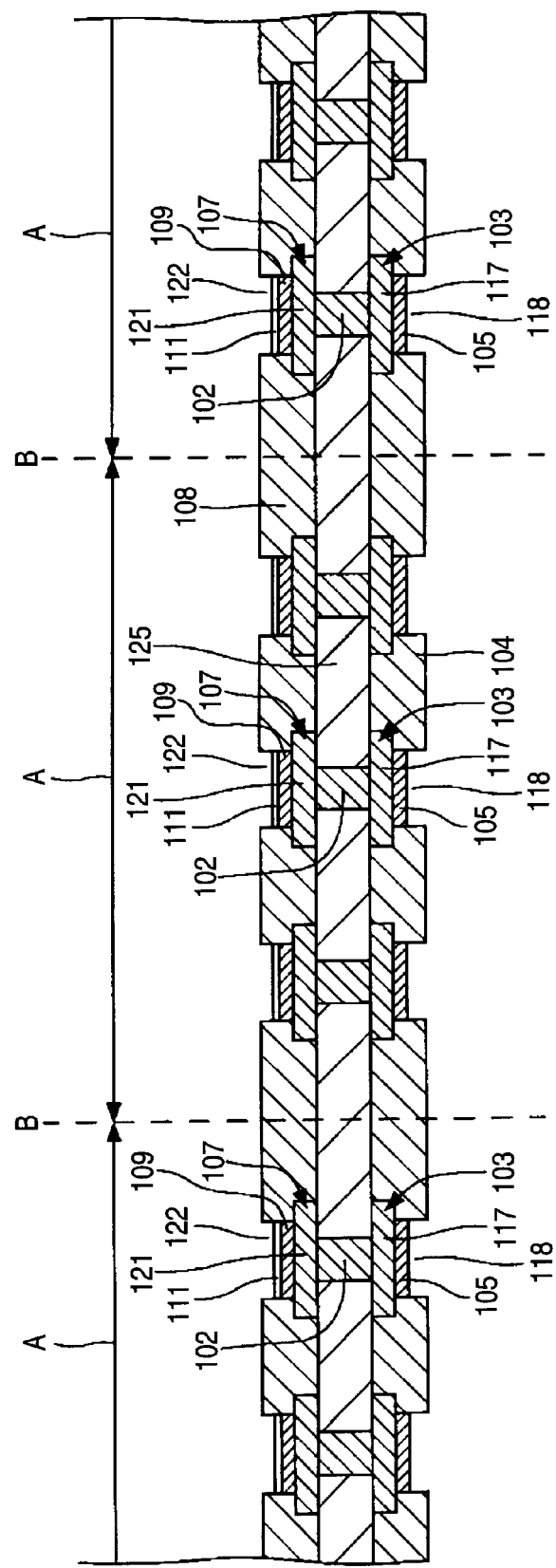
FIG. 13 is a view (No. 3) showing the solder bump forming step according to the first embodiment of the invention.

At a step shown in FIG. 13, subsequently, a metal film 11 capable of chemically reacting to a tackifying compound containing at least one of a naphthotriazole based derivative, a benzotriazole based derivative, an imidazole based derivative, a benzoimidazole based derivative, a mercaptobenzothiazole based derivative and a benzothiazolethio fatty acid based derivative is formed to cover a surface of the diffusion preventing film 109 in an exposed part to the opening portion 122 by a plating method (a metal film forming step).

For the metal film 111 capable of chemically reacting to the tackifying compound, it is possible to use a Cu film or an Ni film, for example. The metal film 111 can be formed by the plating method, for example. In the case in which the Cu film is used as the metal film 111, the metal film 111 can be set to have a thickness of 0.1 $\mu$m to 1.0 $\mu$m, for example. By reducing the thickness of the Cu film to be the metal film 111, thus, it is possible to lessen the influence of a Cu—Pd compound which adversely influences an electrical characteristic.

Figure 14:
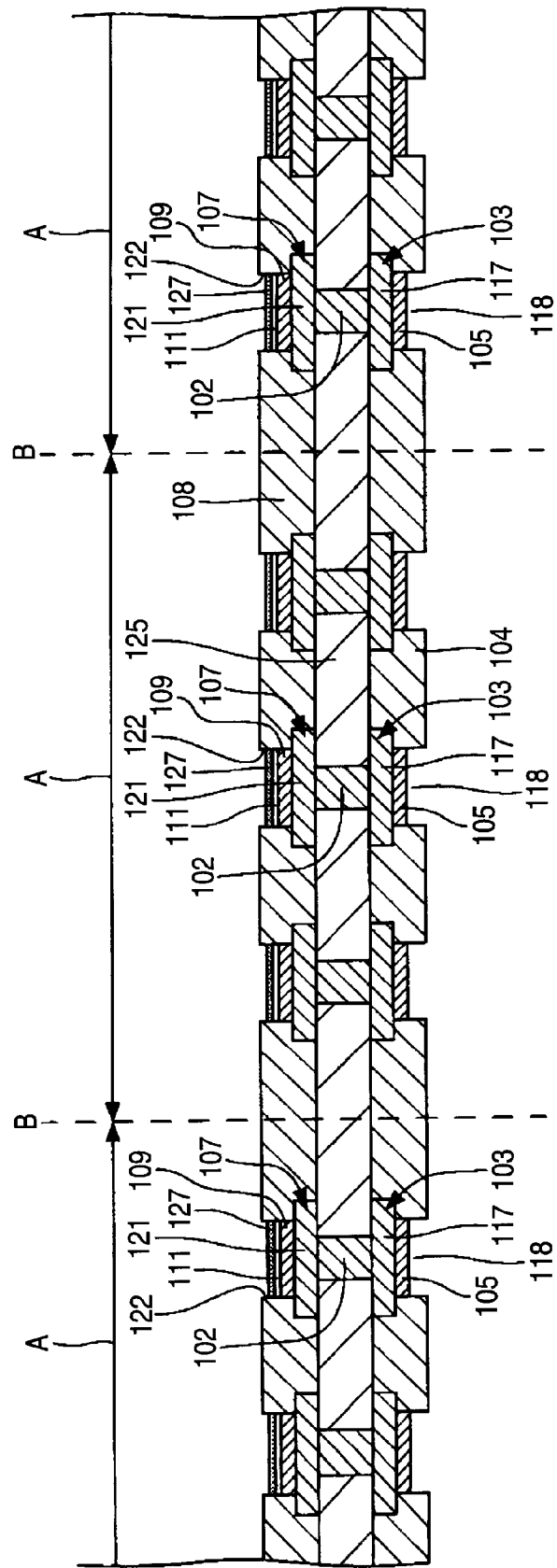
FIG. 14 is a view (No. 4) showing the solder bump forming step according to the first embodiment of the invention.

At a step shown in FIG. 14, next, a solution containing the tackifying compound is caused to chemically react to the metal film 111 to form an organic sticking layer 127 so as to cover the metal film 111 in the exposed part to the opening portion 122 (an organic sticking layer forming step). More specifically, the organic sticking layer 127 is formed by immersing the structure shown in FIG. 13 in a solution containing 0.05 to 20% by weight of at least one of the naphthotriazole based derivative, the benzotriazole based derivative, the imidazole based derivative, the benzoimidazole based derivative, the mercaptobenzothiazole based derivative and the benzothiazolethio fatty acid based derivative or applying the solution to the metal film 111 in the exposed part to the opening portion 122. The organic sticking layer 127 serves to temporarily fix a conductive ball 129 onto the metal film 111 at the step shown in FIG. 16 which will be described below. A thickness of the organic sticking layer 127 can be set to be 50 nm, for example.

Thus, the metal film 111 capable of chemically reacting to the tackifying compound is formed on the pads 107, and the solution containing the tackifying compound and the metal film 111 are then caused to chemically react to each other to form the organic sticking layer 127 on the metal film 111 in the exposed part to the opening portion 122. Also in the case in which the surface of the metal film 111 on which the organic sticking layer 127 is formed has a small area, therefore, it is possible to form the organic sticking layer 127 having an almost equal thickness on the metal film 111. When the conductive balls are to be mounted on the pads 107, consequently, it is possible to reliably mount the respective conductive balls on the pads 107 through the organic sticking layer 127 and the metal film 111 without using the conductive ball mounting mask 26 which has been required in the related art (see FIGS. 4 and 8). Moreover, the conductive ball mounting mask 26 is not required. Consequently, it is possible to reduce a manufacturing cost of the substrate 100 in which the solder bumps 112 are formed.

Figure 15:
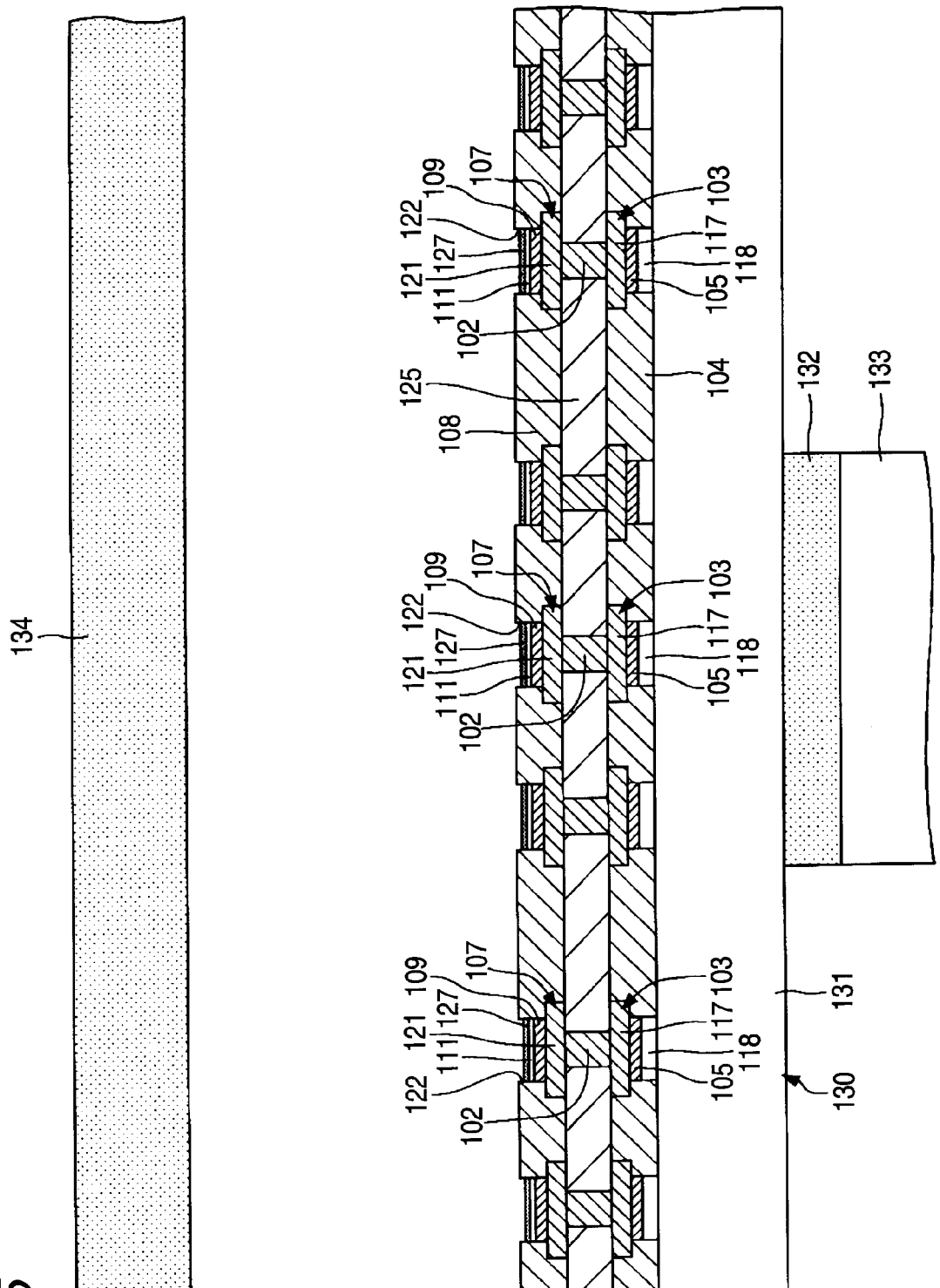
FIG. 15 is a view (No. 5) showing the solder bump forming step according to the first embodiment of the invention.

At a step shown in FIG. 15, subsequently, the structure shown in FIG. 14 is fixed onto a stage 131 of a conductive ball supplying device 130 in such a manner that a plurality of conductive balls can be dropped onto the structure shown in FIG. 14 at a side where the organic sticking layer 127 is formed. The conductive ball supplying device 130 has such a structure as to have a stage 131, an oscillating device 132 for oscillating the stage 131, a support 133 for supporting the stage 131 through the oscillating device 132, and a conductive ball housing 134 disposed above the stage 131 and serving to drop the conductive balls 129 (see FIG. 16) on the structure fixed onto the stage 131.

Figure 16:
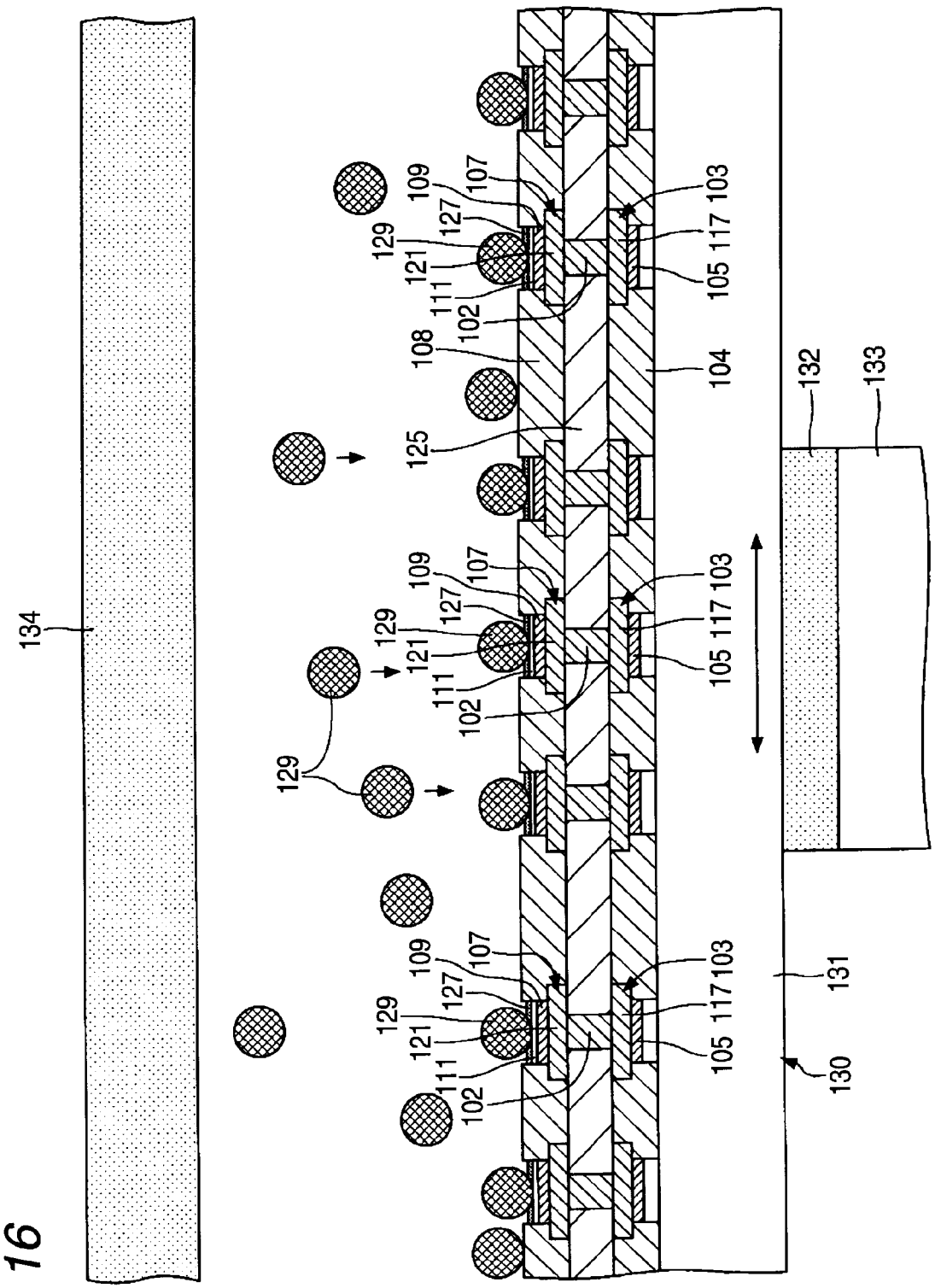
FIG. 16 is a view (No. 6) showing the solder bump forming step according to the first embodiment of the invention.

At the step shown in FIG. 16, then, the conductive balls 129 are dropped from the conductive ball housing 134 disposed above the stage 131 and the structure including the pads 107 is oscillated (the stage 131 is oscillated) to mount one of the conductive balls 129 on each of the pads 107 in which the metal film 111 and the organic sticking layer 127 are formed (a conductive ball mounting step).

For the conductive ball 129, it is possible to use a solder ball constituted by an Sn—Ag—Cu alloy or a solder ball constituted by an Sn—Ag alloy, for example. Moreover, a diameter of the conducive ball 129 can be set to be 80 $\mu$m to 90 $\mu$m, for example.

Figure 17:
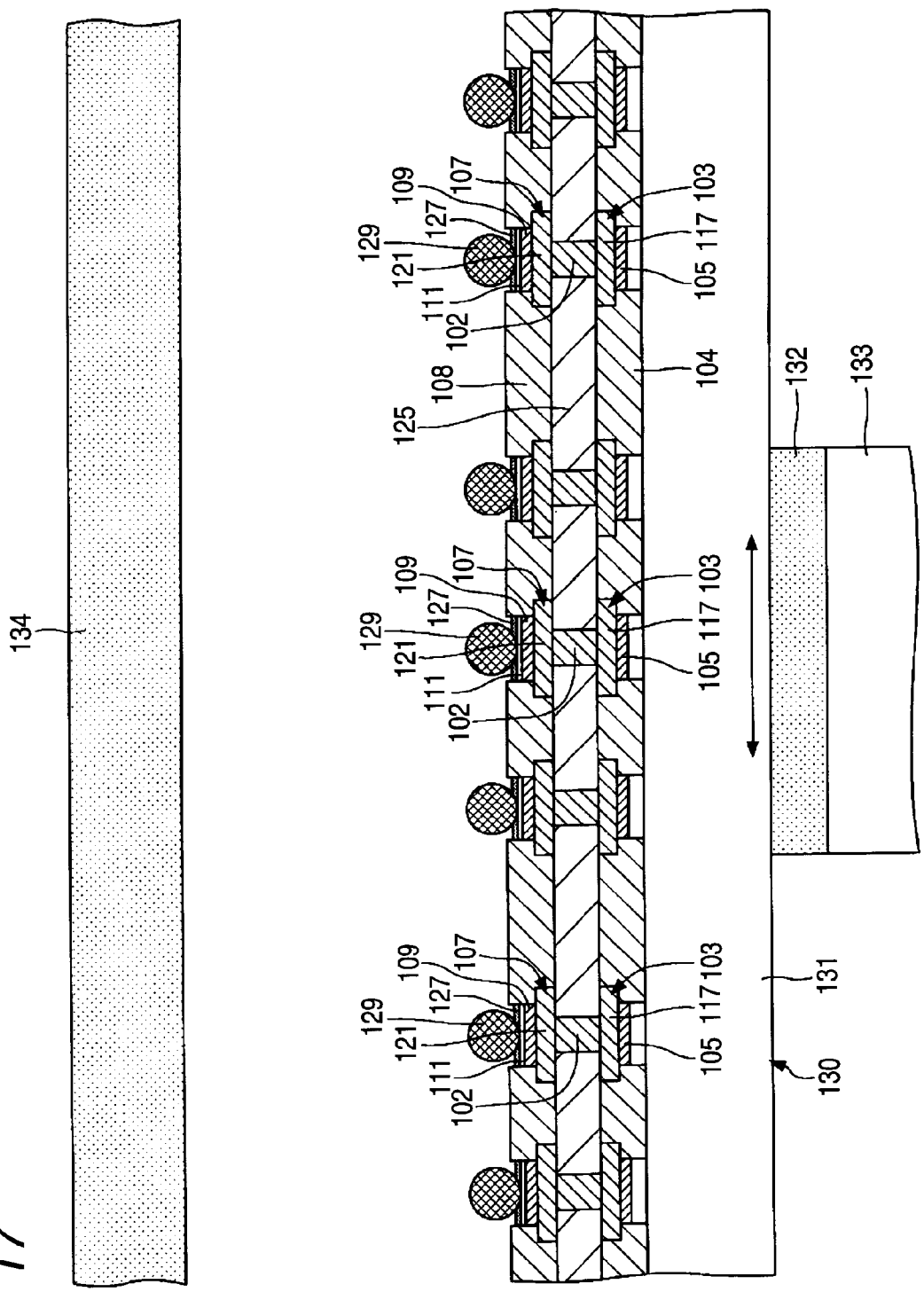
FIG. 17 is a view (No. 7) showing the solder bump forming step according to the first embodiment of the invention.

At a step shown in FIG. 17, thereafter, the structure fixed onto the stage 131 is oscillated in a state in which the drop of the conductive balls 129 is stopped. Thus, the excessive conductive ball 129 which cannot be mounted on the metal film 111 is removed or collected from the solder resist 108.

Figure 18:
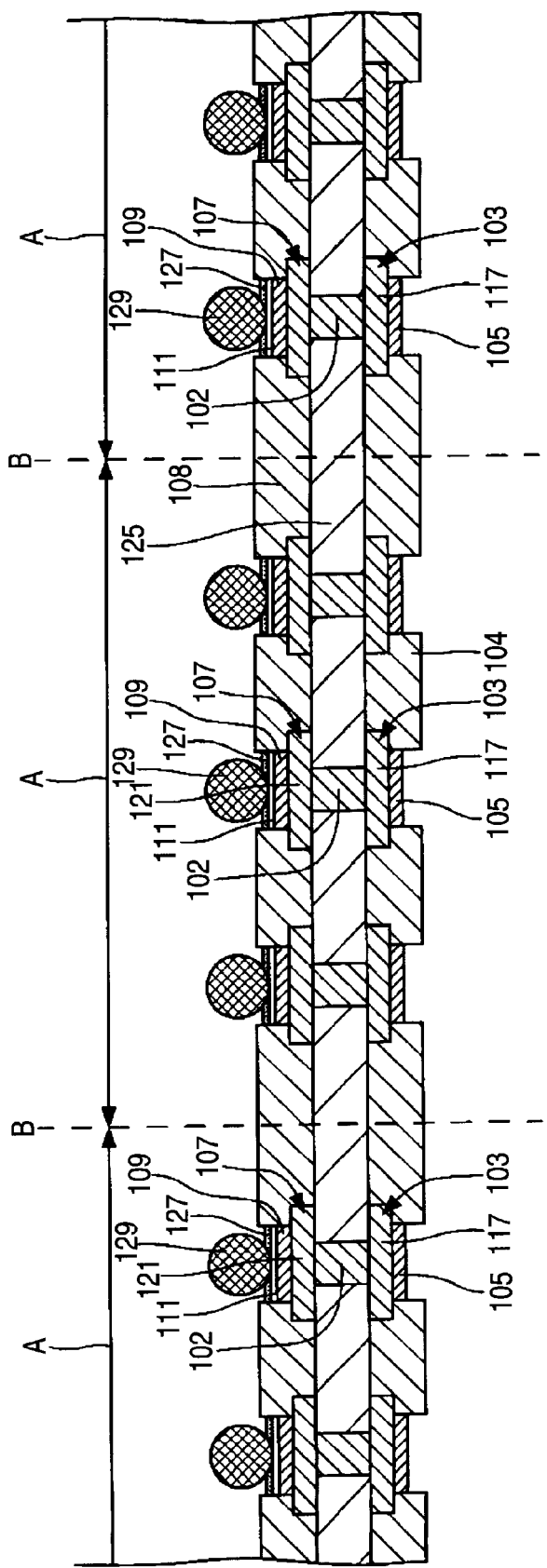
FIG. 18 is a view (No. 8) showing the solder bump forming step according to the first embodiment of the invention.

At a step shown in FIG. 18, next, the structure on which the conductive ball 129 shown in FIG. 17 is mounted is removed from the stage 131.

At a step shown in FIG. 19, subsequently, the conductive balls 129 shown in FIG. 18 are subjected to a reflow treatment to form a solder bump 112 on each metal film 111. Consequently, a structure corresponding to the substrate 100 is formed in a plurality of substrate forming regions A provided in the base material 125. At the step shown in FIG. 19, the organic sticking layer 127 volatilizes in the reflow treatment.

Figure 19:
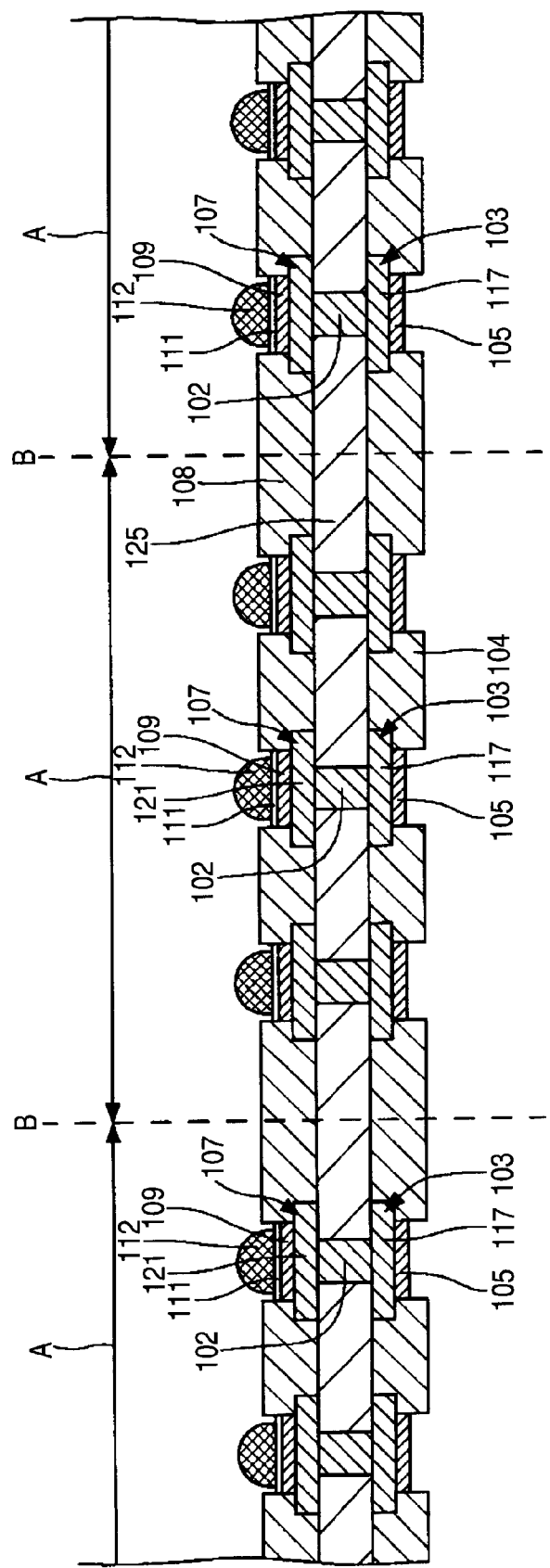
FIG. 19 is a view (No. 9) showing the solder bump forming step according to the first embodiment of the invention.

The reflow treatment for the conductive balls 129 at the step shown in FIG. 19 is carried out without using a flux.

By carrying out the reflow treatment for the conductive balls 129 without using the flux, thus, it is not necessary to execute a flux applying treatment and a flux washing step (a washing step using an organic solvent) after the reflow treatment for the conductive ball 129. Therefore, the process for manufacturing the substrate 100 can be simplified. Consequently, it is possible to reduce the manufacturing cost of the substrate 100.

Since the flux is not used, moreover, it is not necessary to execute a periodic cleaning work in a reflow furnace which has been required in the related art.

Since the flux is not used, furthermore, a residue of the flux is not generated on a surface of the solder bump 112 or that of the substrate 100. Therefore, it is possible to prevent a corrosion of the solder bump 112 and the pad 107 due to the flux. Consequently, it is possible to enhance an electrical connecting reliability of the substrate 100 and a semiconductor chip to be mounted on the substrate 100 and an electrical connecting reliability between the semiconductor chip and the substrate 100.

As described above, at the step shown in FIG. 19, in the case in which the metal film 111 provided on the diffusion preventing film 109 has a great thickness (which is equal to or greater than 0.5 μm, for example), the metal film 111 is left on the diffusion preventing film 109 as shown in FIG. 19. In the case in which the metal film 111 has a small thickness (which is smaller than 0.5 μm, for example), however, the metal film 111 is not left after the solder bump 112 is formed because the whole metal film 111 is diffused into the solder in the reflow treatment for the conductive ball 129.

Figure 20:
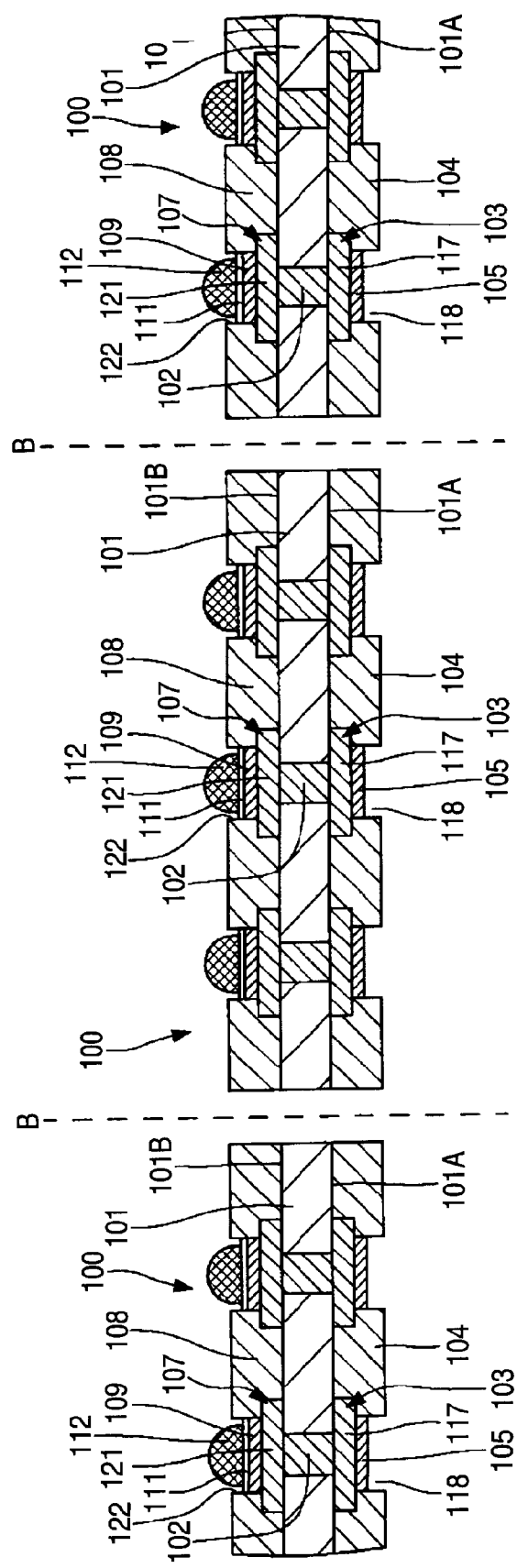
FIG. 20 is a view (No. 10) showing the solder bump forming step according to the first embodiment of the invention.

At a step shown in FIG. 20, subsequently, the structure shown in FIG. 19 is cut along the cutting position B. Consequently, a plurality of substrates 100 is manufactured.

According to the bump forming method in accordance with the embodiment, the metal film 111 capable of chemically reacting to the tackifying compound is formed on the pads 107, and the solution containing the tackifying compound and the metal film 111 are then caused to chemically react to each other to form the organic sticking layer 127 on the metal film 111 in the exposed part to the opening portion 122. Also in the case in which the surface of the metal film 111 on which the organic sticking layer 127 is formed has a small area, therefore, it is possible to form the organic sticking layer 127 having an almost equal thickness on the metal film 111. When the conductive balls 129 are to be mounted on the pads 107, consequently, it is possible to reliably mount one of the conductive balls 129 on each of the pads 107 through the organic sticking layer 127 and the metal film 111 without using the conductive ball mounting mask 26 which has been required in the related art (see FIG. 4). Moreover, the conductive ball mounting mask 26 is not required. Consequently, it is possible to reduce a manufacturing cost of the substrate 100 in which the solder bumps 112 are formed.

Figure 21:
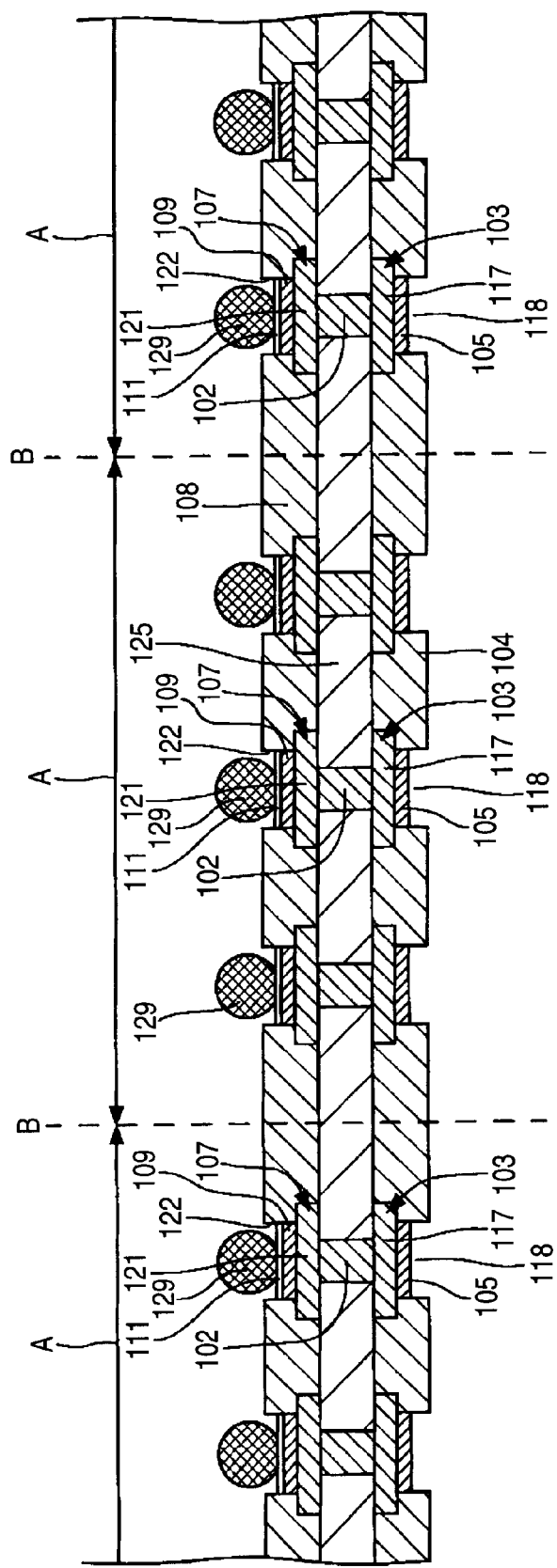
FIG. 21 is a view (No. 1) showing a solder bump forming step according to a variant of the first embodiment of the invention.
Figure 22:
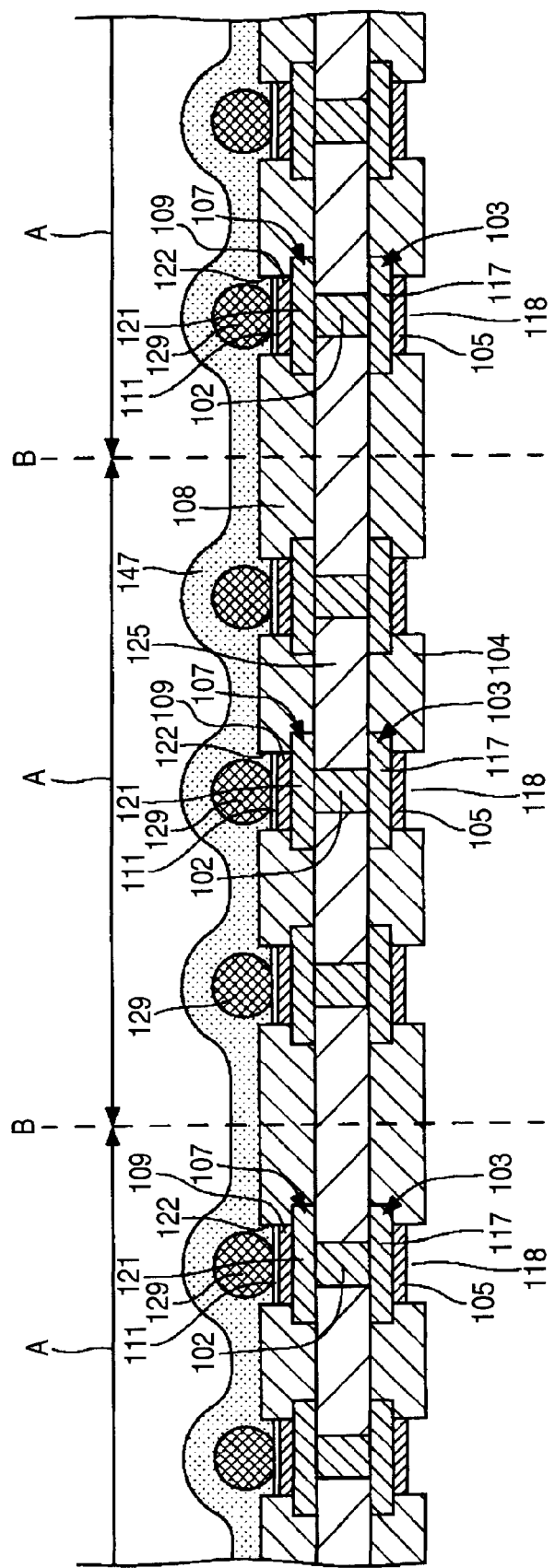
FIG. 22 is a view (No. 2) showing the solder bump forming step according to the variant of the first embodiment of the invention.
Figure 23:
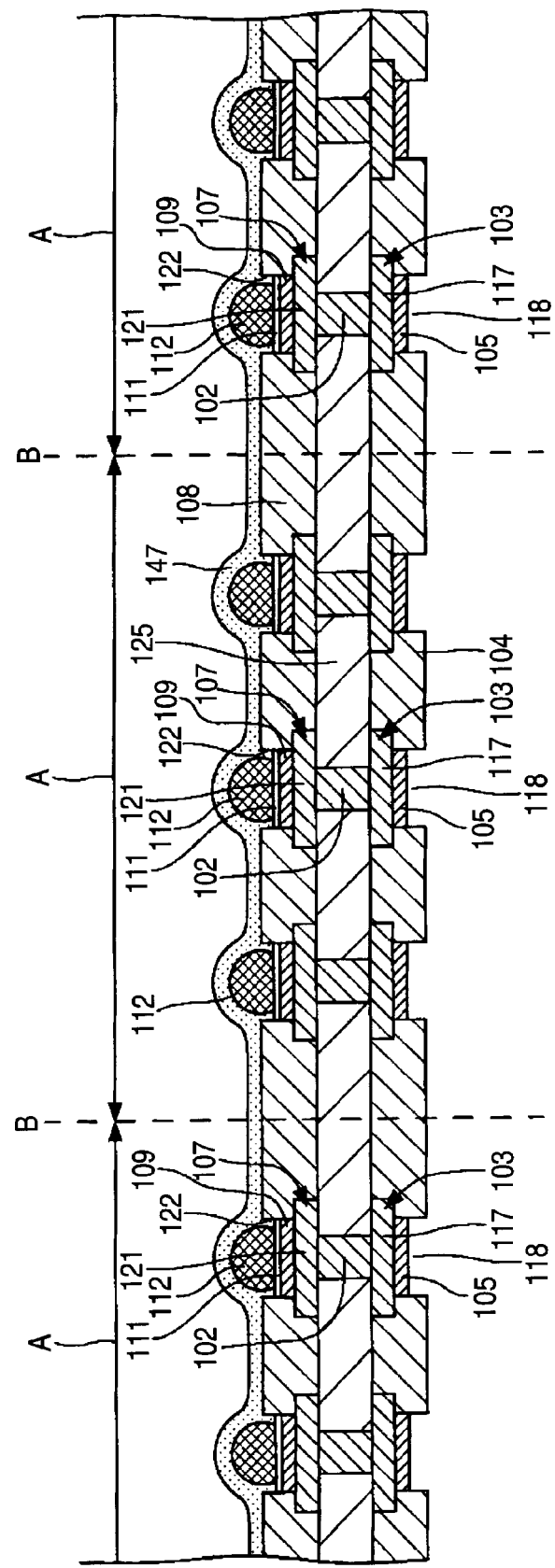
FIG. 23 is a view (No. 3) showing the solder bump forming step according to the variant of the first embodiment of the invention.

FIGS. 21 to 23 are views showing a solder bump forming process according to a variant of the first embodiment of the invention. In FIGS. 21 to 23, the same components as those in the structures shown in FIGS. 11 to 20 described above have the same reference numerals.

With reference to FIGS. 21 to 23, a solder bump forming method according to the variant of the embodiment will be described by taking, as an example, the case in which the substrate 100 according to the first embodiment is manufactured.

First of all, the same processings as those of the steps shown in FIGS. 11 to 18 described above are carried out to form the structure shown in FIG. 18. At a step shown in FIG. 21, next, a solder contained in a conductive ball 129 is molten by half to temporarily fix the conductive ball 129 to a pad 107 through a metal film 111.

Thus, the solder contained in the conductive ball 129 is molten by half to temporarily fix the conductive ball 129 to the pad 107 through the metal film 111. At a step shown in FIG. 22 which will be described below, therefore, it is possible to prevent the conductive ball 129 from slipping from the pad 107 when forming a flux 147 to cover the conductive ball 129.

At the step shown in FIG. 22, next, the flux 147 is formed to cover a surface on a side where the conductive ball 129 of the structure shown in FIG. 21 is temporarily fixed and the conductive ball 129. The flux 147 is formed by a coating process for example.

At a step shown in FIG. 23, then, the conductive ball 129 is subjected to a reflow treatment to form a solder bump 112. At this time, most of the flux 147 volatilizes. Therefore, a thickness of the flux 147 obtained after processing the step shown in FIG. 23 is smaller than that of the flux 147 provided in the structure shown in FIG. 22.

Thereafter, the flux 147 in the step shown in FIG. 23 is removed through washing. Subsequently, the processing in the step shown in FIG. 20 described above is carried out so that a plurality of substrates 100 is manufactured.

According to the bump forming method in accordance with the variant of the embodiment, by using the flux 147 when carrying out the reflow over the conductive ball 129 to form the solder bump 112, it is possible to sufficiently maintain a bonding strength of the solder bump 112 and the pad 107 and a wettability of the solder. It is preferable to decide whether the solder bump forming method according to the variant of the embodiment is used depending on a composition of the solder constituting the conductive ball 129.

In the case in which the flux is applied in a state in which the conductive ball 129 is simply bonded to the organic sticking layer 127 (the state shown in FIG. 18), moreover, the organic sticking layer 127 is dissolved by the flux so that the conductive ball 129 slips from the pad 107. For this reason, it is preferable that the conductive ball 129 should be dissolved by half and fixed temporality as shown in FIG. 21.

In some cases in which the reflow step having no flux is carried out as shown in FIG. 19, moreover, the organic sticking layer 127 does not completely volatilize but remains. In this case, the organic sticking layer 127 is perfectly removed through the flux, resulting in an enhancement in the bonding strength of the solder by the application of the variant of the first embodiment, which is suitable.

Second Embodiment

Figure 24:
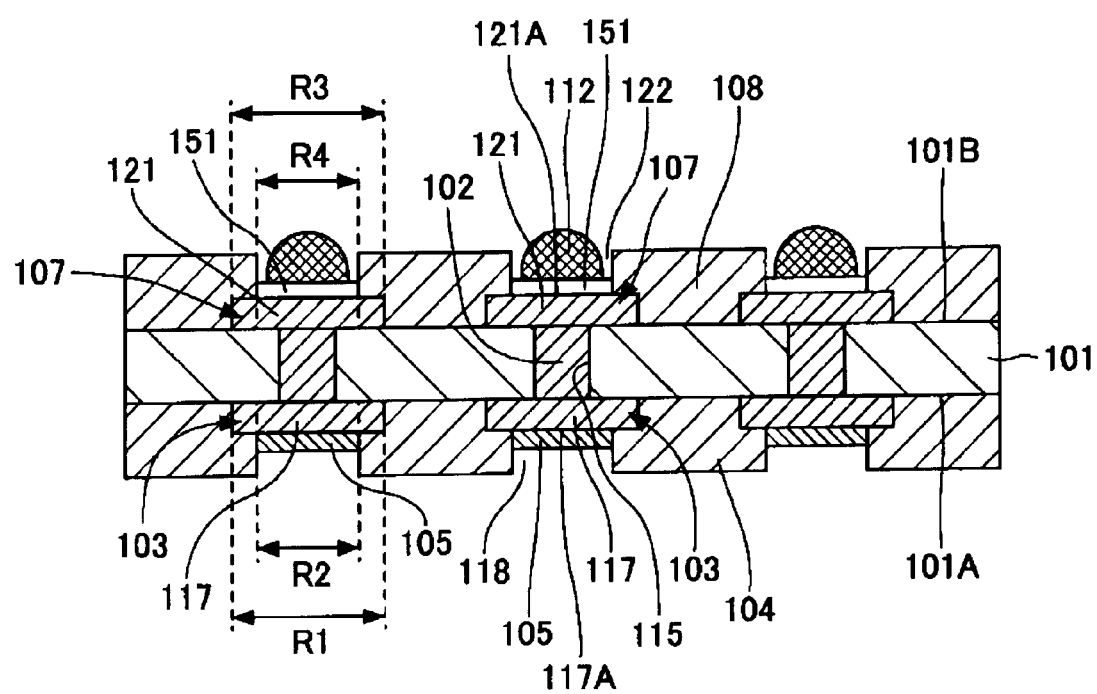
FIG. 24 is a sectional view showing a substrate according to a second embodiment of the invention.

FIG. 24 is a sectional view showing a substrate according to a second embodiment of the invention. In FIG. 24, the same components as those in the substrate 100 according to the first embodiment have the same reference numerals.

With reference to FIG. 24, a substrate 150 according to the second embodiment has the same structure as that of the substrate 100 except that a metal film 151 is provided in place of the diffusion preventing film 109 and the metal film 111 which are provided in the substrate 100 according to the first embodiment.

The metal film 151 is provided to cover a surface 121A of a connecting portion 121 an opposite side to a surface provided in contact with an upper surface 101B of the substrate body 101. The metal film 151 can chemically react to the tackifying compound described in the first embodiment. The metal film 151 serves to react to a solution containing the tackifying compound described in the first embodiment, thereby forming an organic sticking layer for temporarily fixing a conductive ball 129 to the metal film 151. For the metal film 151, it is possible to use an Ni film formed by a plating method, for example. In the case in which the Ni film is used as the metal film 151, a thickness of the metal film 151 can be set to be equal to or greater than 3 µm (for example, 3 µm to 8 µm), for instance.

For the substrate 150 having the structure described above (the structure of the pad of the substrate), it is possible to use a wiring board, a package such as a chip size package, or a semiconductor chip, for example.

Referring to the substrate 150 according to the embodiment, the description has been given by taking, as an example, the case in which the metal film 151 provided on the connecting portion 121 has a great thickness (which is equal to or greater than 0.5 µm, for example. The case in which only a part of the metal film 151 is diffused into a solder when a solder bump 112 is to be formed). In the case in which the metal film 151 has a small thickness (which is smaller than 0.5 µm, for example), the whole metal film 151 is diffused into the solder when a reflow treatment for the conductive ball 129 is carried out to form the solder bump 112. For this reason, the metal film 151 is not left after the solder bump 112 is formed. In other words, as shown in FIG. 25 which will be described below, the metal film 151 is not present on a substrate 180 which is a finished member.

Figure 25:
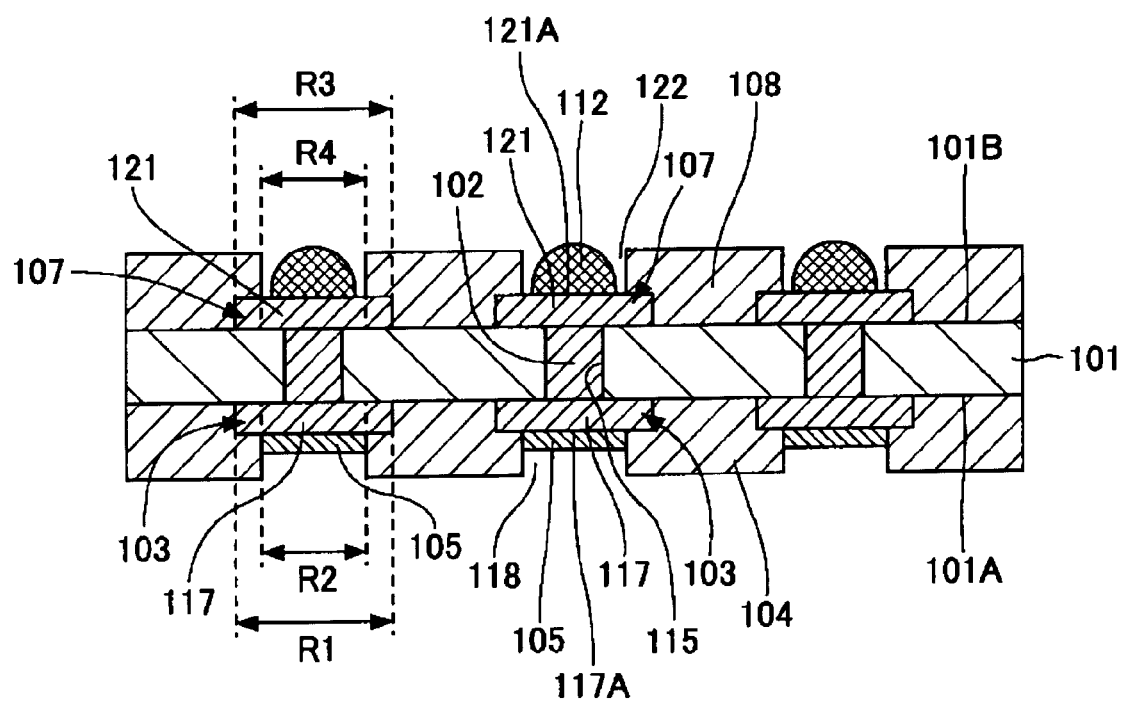
FIG. 25 is a sectional view showing a substrate according to a variant of the second embodiment of the invention.

FIG. 25 is a sectional view showing a substrate according to a variant of the second embodiment of the invention. In FIG. 25, the same components as those in the substrate 150 according to the second embodiment have the same reference numerals.

With reference to FIG. 25, a substrate 180 according to the variant of the second embodiment has the same structure as that of the substrate 150 except that the whole metal film 151 provided in the substrate 150 according to the second embodiment is diffused into the solder bump 112.

FIGS. 26 to 30 are views showing a solder bump forming process according to the second embodiment of the invention. In FIGS. 26 to 30, the same components as those of the substrate 150 according to the second embodiment have the same reference numerals.

Figure 12:
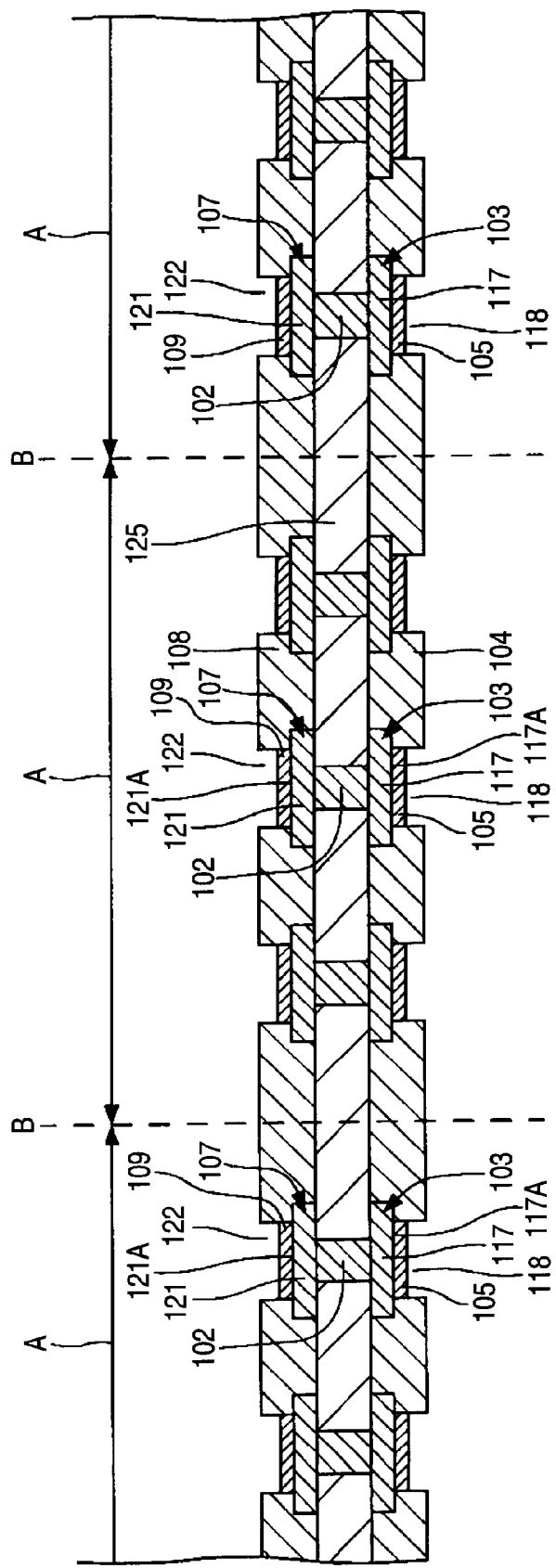
FIG. 12 is a view (No. 2) showing the solder bump forming step according to the first embodiment of the invention.
Figure 26:
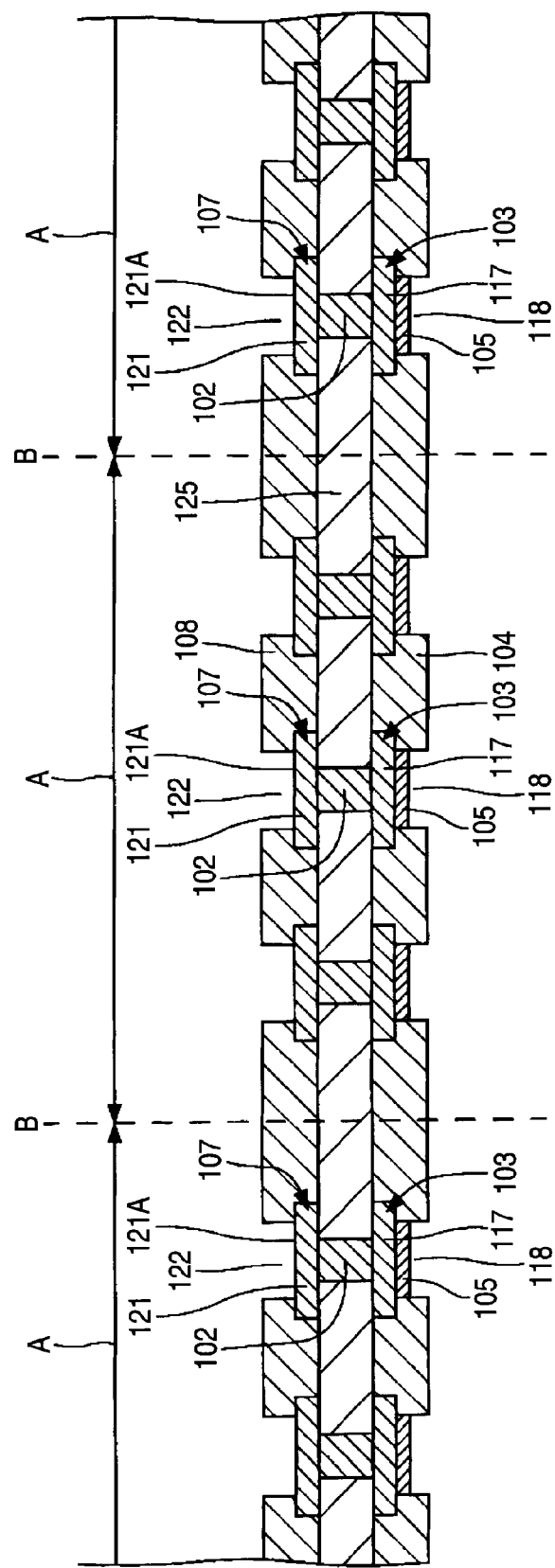
FIG. 26 is a view (No. 1) showing a solder bump forming step according to the second embodiment of the invention.
Figure 27:
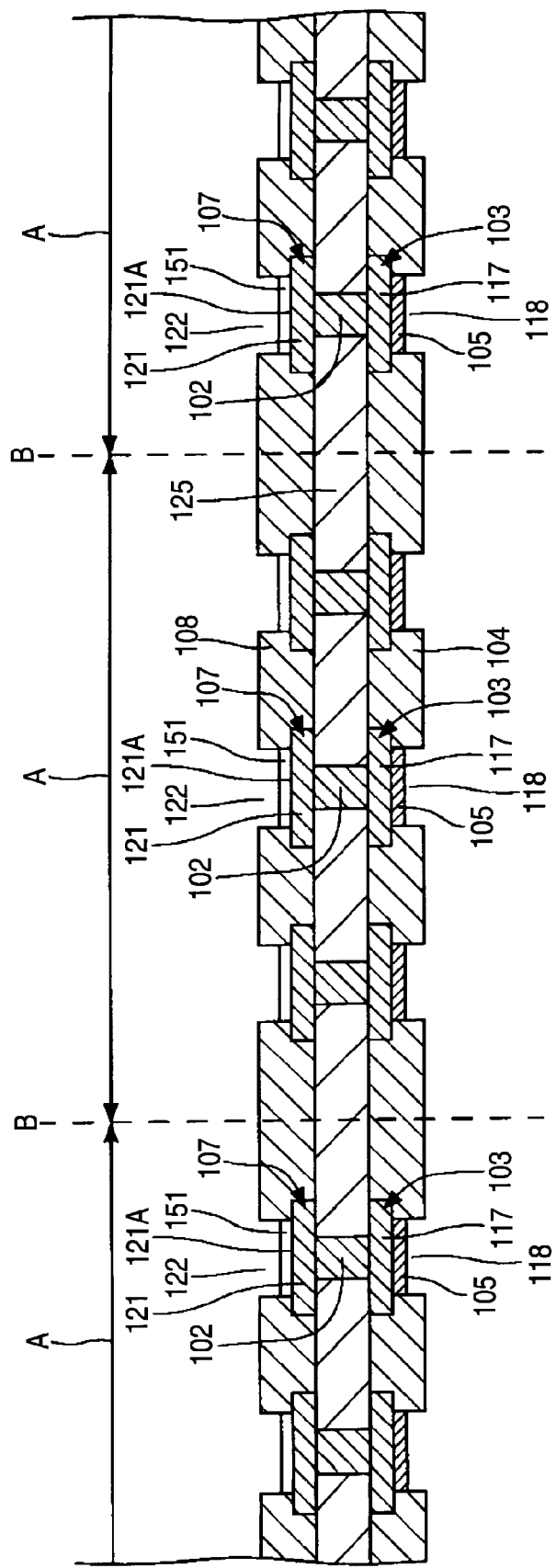
FIG. 27 is a view (No. 2) showing the solder bump forming step according to the second embodiment of the invention.

First of all, at a step shown in FIG. 26, the same processings as those in the steps shown in FIGS. 11 and 12 described in the first embodiment are carried out to form a structure shown in FIG. 26. At a step shown in FIG. 27, subsequently, a metal film 151 capable of chemically reacting to a tackifying compound containing at least one of a naphthotriazole based derivative, a benzotriazole based derivative, an imidazole based derivative, a benzoimidazole based derivative, a mercaptobenzothiazole based derivative and a benzothiazolethio fatty acid based derivative is formed to cover a surface 121A of a connecting portion 121 in an exposed part to an opening portion 122 by a plating method (a metal film forming step). For the metal film 151 capable of chemically reacting to the tackifying compound, it is possible to use an Ni film, for example. In the case in which the Ni film is used as the metal film 151, the metal film 151 can be set to have a thickness which is equal to or greater than 3 µm (for example, 3 µm to 8 µm, for example), for instance.

Moreover, the metal film 151 may be formed simultaneously with the formation of a diffusion preventing film 105. For example, the diffusion preventing film 105 is constituted by an Ni/Pd/Au laminated film, an Ni layer (an Ni film) is simultaneously formed on the surface 121A in the formation of the Ni layer on a surface 117A, and then, a Pd layer and an Au layer are sequentially formed on the surface 117A by using the surface 121A as a mask by the plating method so that the diffusion preventing film 105 and the metal film 151 are formed at the same time.

Figure 28:
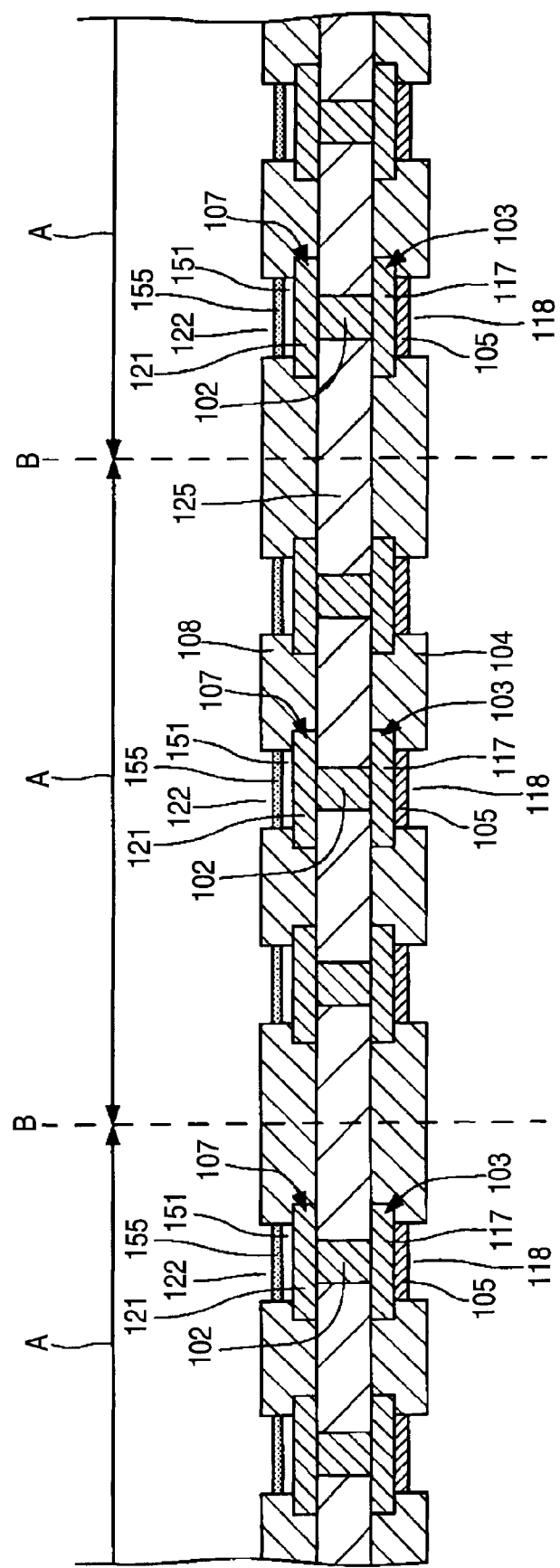
FIG. 28 is a view (No. 3) showing the solder bump forming step according to the second embodiment of the invention.

At a step shown in FIG. 28, next, a solution containing the tackifying compound is caused to chemically react to the metal film 151 to form an organic sticking layer 155 so as to cover the metal film 151 in the exposed part to the opening portion 122 (an organic sticking layer forming step). More specifically, the organic sticking layer 155 is formed by immersing the structure shown in FIG. 27 in a solution containing 0.05 to 20% by weight of at least one of the naphthotriazole based derivative, the benzotriazole based derivative, the imidazole based derivative, the benzoimidazole based derivative, the mercaptobenzothiazole based derivative and the benzothiazolethio fatty acid based derivative or applying the solution to the metal film 151 in the exposed part to the opening portion 122. The organic sticking layer 155 serves to temporarily fix a conductive ball 129 at a step shown in FIG. 29 which will be described below. A thickness of the organic sticking layer 155 can be set to be 50 nm, for example.

Thus, the metal film 151 capable of chemically reacting to the tackifying compound is formed on the pads 107, and the solution containing the tackifying compound and the metal film 151 are then caused to chemically react to each other to form the organic sticking layer 155 on the metal film 151 in the exposed part to the opening portion 122. Also in the case in which the surface of the metal film 151 on which the organic sticking layer 155 is formed has a small area, therefore, it is possible to form the organic sticking layer 155 having an almost equal thickness on the metal film 151. When conductive balls 129 are to be mounted on the pads 107, consequently, it is possible to reliably mount one of the conductive balls 129 on each of the pads 107 through the organic sticking layer 155 and the metal film 151 without using the conductive ball mounting mask 26 which has been required in the related art (see FIGS. 4 and 8). Moreover, the conductive ball mounting mask 26 is not required. Consequently, it is possible to reduce a manufacturing cost of the substrate 150 in which a plurality of solder bumps 112 is formed.

Figure 29:
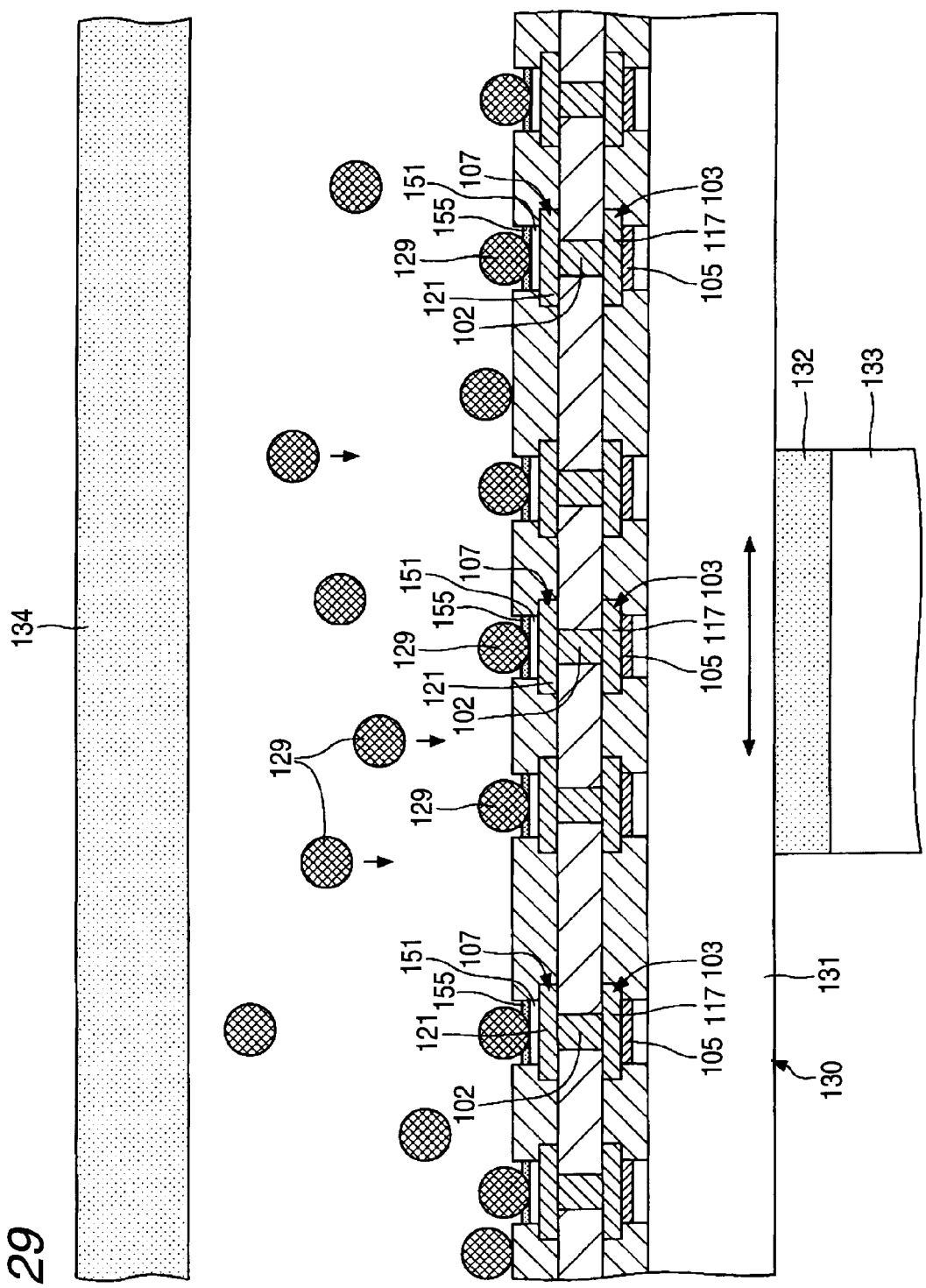
FIG. 29 is a view (No. 4) showing the solder bump forming step according to the second embodiment of the invention.

At a step shown in FIG. 29, subsequently, the conductive balls 129 are dropped from a conductive ball housing 134 disposed above a stage 131 of a conductive ball supplying device 130 and the structure including the pads 107 is oscillated (the stage 131 is oscillated) to mount one of the conductive balls 129 on each of the pads 107 in which the metal film 151 and the organic sticking layer 155 are formed (a conductive ball mounting step).

Figure 30:
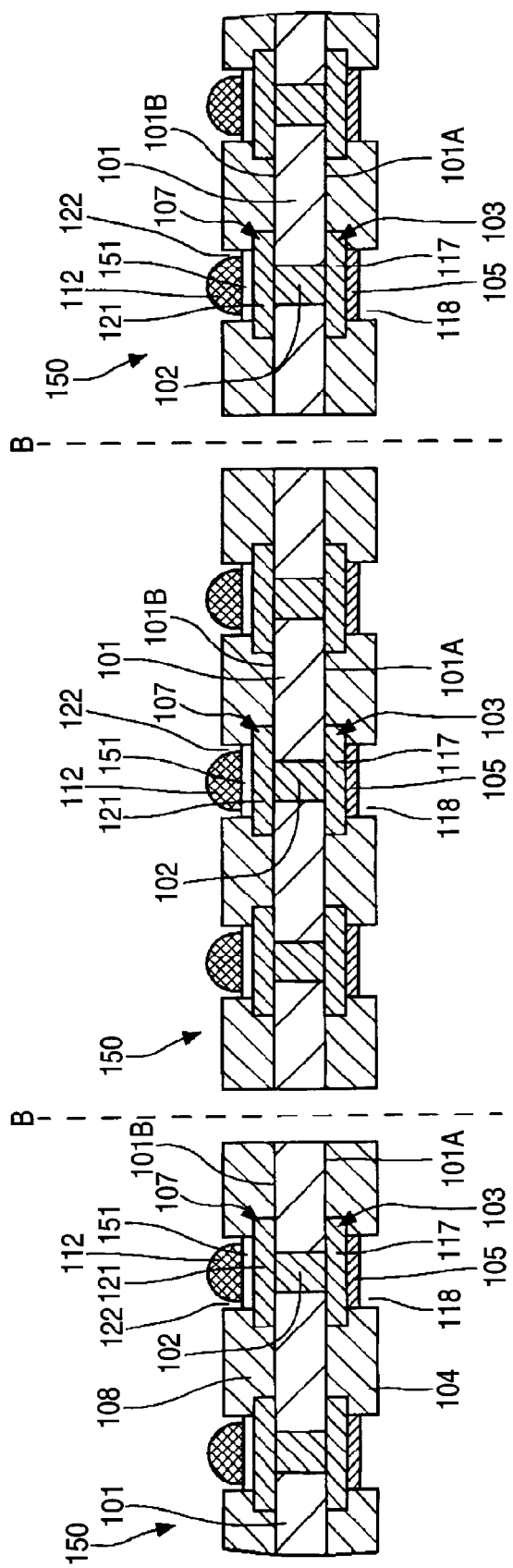
FIG. 30 is a view (No. 5) showing the solder bump forming step according to the second embodiment of the invention.

Then, the same processings as those in the steps shown in FIGS. 17 to 20 described in the first embodiment are carried out so that a plurality of substrates 150 is manufactured as shown in FIG. 30.

According to the bump forming method in accordance with the embodiment, the metal film 151 capable of chemically reacting to the tackifying compound is formed on the pads 107, and the solution containing the tackifying compound and the metal film 151 are then caused to chemically react to each other to form the organic sticking layer 155 on the metal film 151 in the exposed part to the opening portion 122. Also in the case in which the surface of the metal film 151 on which the organic sticking layer 155 is formed has a small area, therefore, it is possible to form the organic sticking layer 155 having an almost equal thickness on the metal film 151. When the conductive balls 129 are to be mounted on the pads 107, consequently, it is possible to reliably mount one of the conductive balls 129 on each of the pads 107 through the organic sticking layer 155 and the metal film 151 without using the conductive ball mounting mask 26 which has been required in the related art (see FIGS. 4 and 8). Moreover, the conductive ball mounting mask 26 is not required. Consequently, it is possible to reduce a manufacturing cost of the substrate 150 in which the solder bumps 112 are formed.

Figure 31:
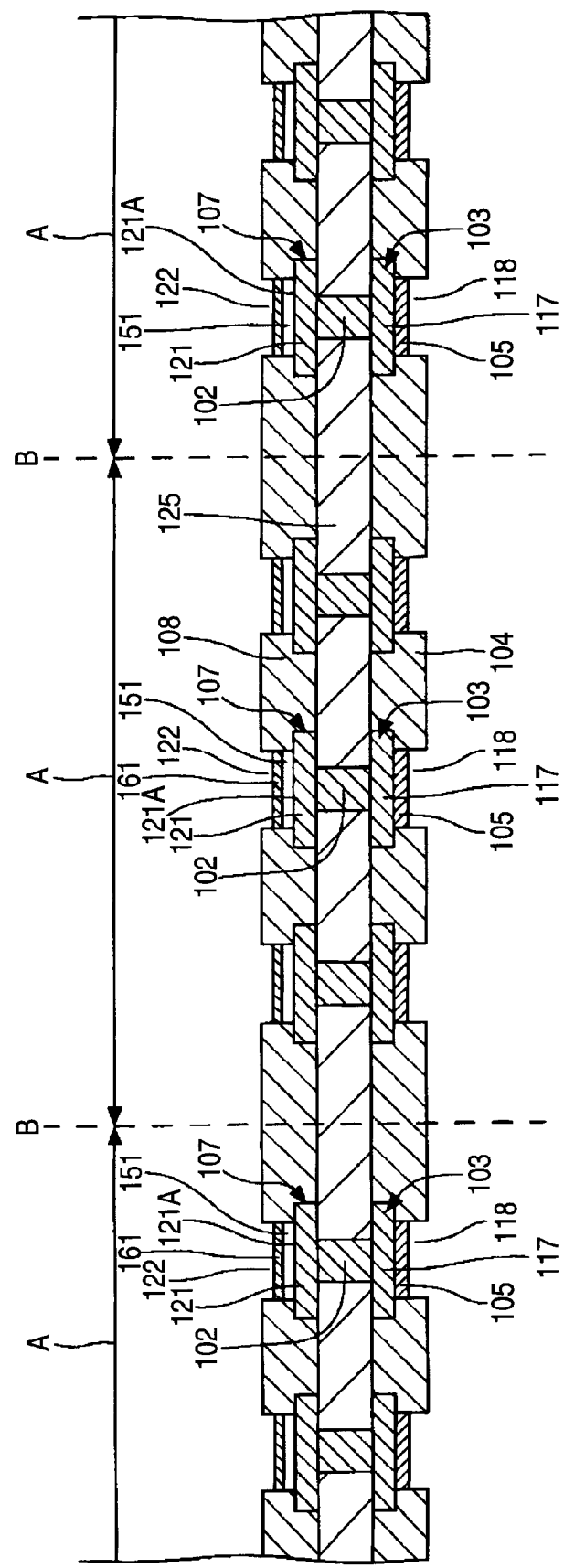
FIG. 31 is a view (No. 1) showing a solder bump forming step according to a variant of the second embodiment of the invention.
Figure 32:
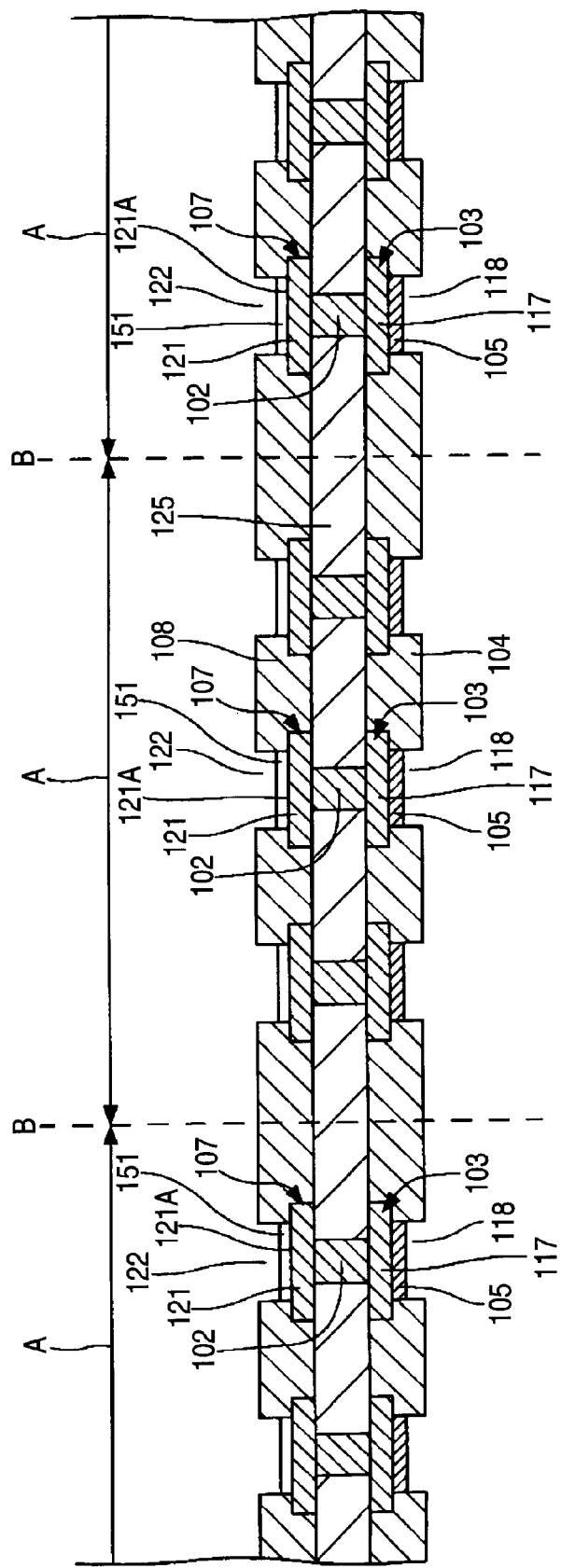
FIG. 32 is a view (No. 2) showing the solder bump forming step according to the variant of the second embodiment of the invention.

FIGS. 31 and 32 are views showing a solder bump forming process according to a variant of the second embodiment of the invention.

With reference to FIGS. 31 and 32, description will be given to a solder bump forming method according to the variant of the second embodiment. First of all, the same processings as those of the steps shown in FIGS. 26 and 27 described above are carried out to form the structure shown in FIG. 27.

At a step shown in FIG. 31, next, an Au film 161 is formed to cover a surface of a metal film 151 exposed to an opening portion 122 by a plating method. By forming the Au film 161 to cover the surface of the metal film 151, thus, an Ni film which is apt to be oxidized can be prevented from being oxidized when the Ni film is used as the metal film 151. In the case in which a structure having the metal film 151 formed therein is left for a while (an organic sticking layer 155 is not formed immediately after the formation of the metal film 151), accordingly, it is effective to form the Au film 161 so as to cover the surface of the metal film 151 (in this case, the Ni film).

At a step shown in FIG. 32, then, the Au film 161 shown in FIG. 31 is removed. Thereafter, the same processings as those in the steps shown in FIGS. 28 to 30 described above are carried out so that a plurality of substrates 150 is manufactured.

Although the preferred embodiments according to the invention have been described above in detail, the invention is not restricted to the specific embodiments but various changes and modifications can be made without departing from the scope of the invention described in the claims.

While the description has been given by taking, as an example, the case in which the conductive ball 129 is dropped and mounted onto the organic sticking layers 127 and 155 in the first and second embodiments, for instance, it is also possible to mount the conductive ball 129 on the organic sticking layers 127 and 155 by using a method shown in FIGS. 33 and 34 or a method shown in FIGS. 35 and 36 which will be described below.

Figure 33:
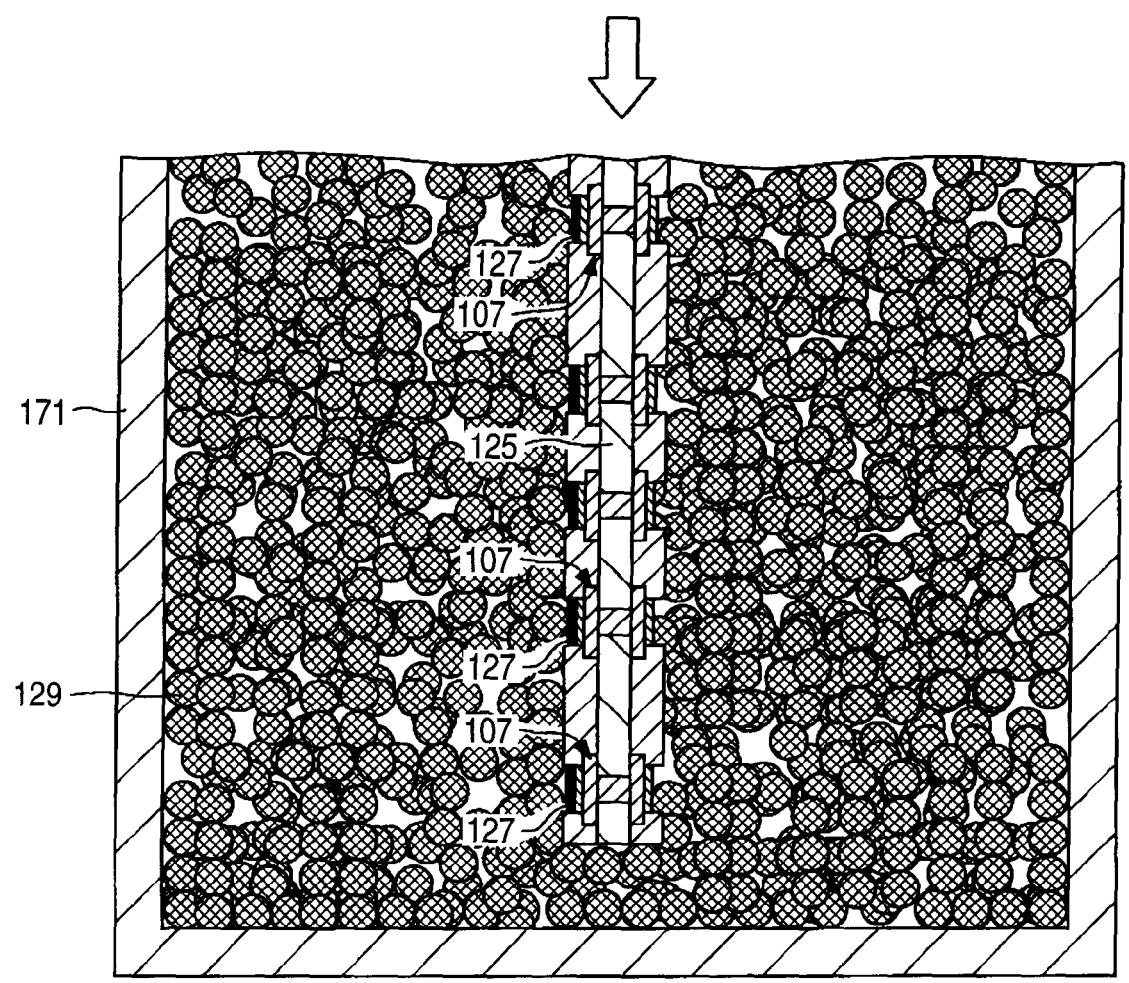
FIG. 33 is a view (No. 1) for explaining another conductive ball mounting method.
Figure 34:
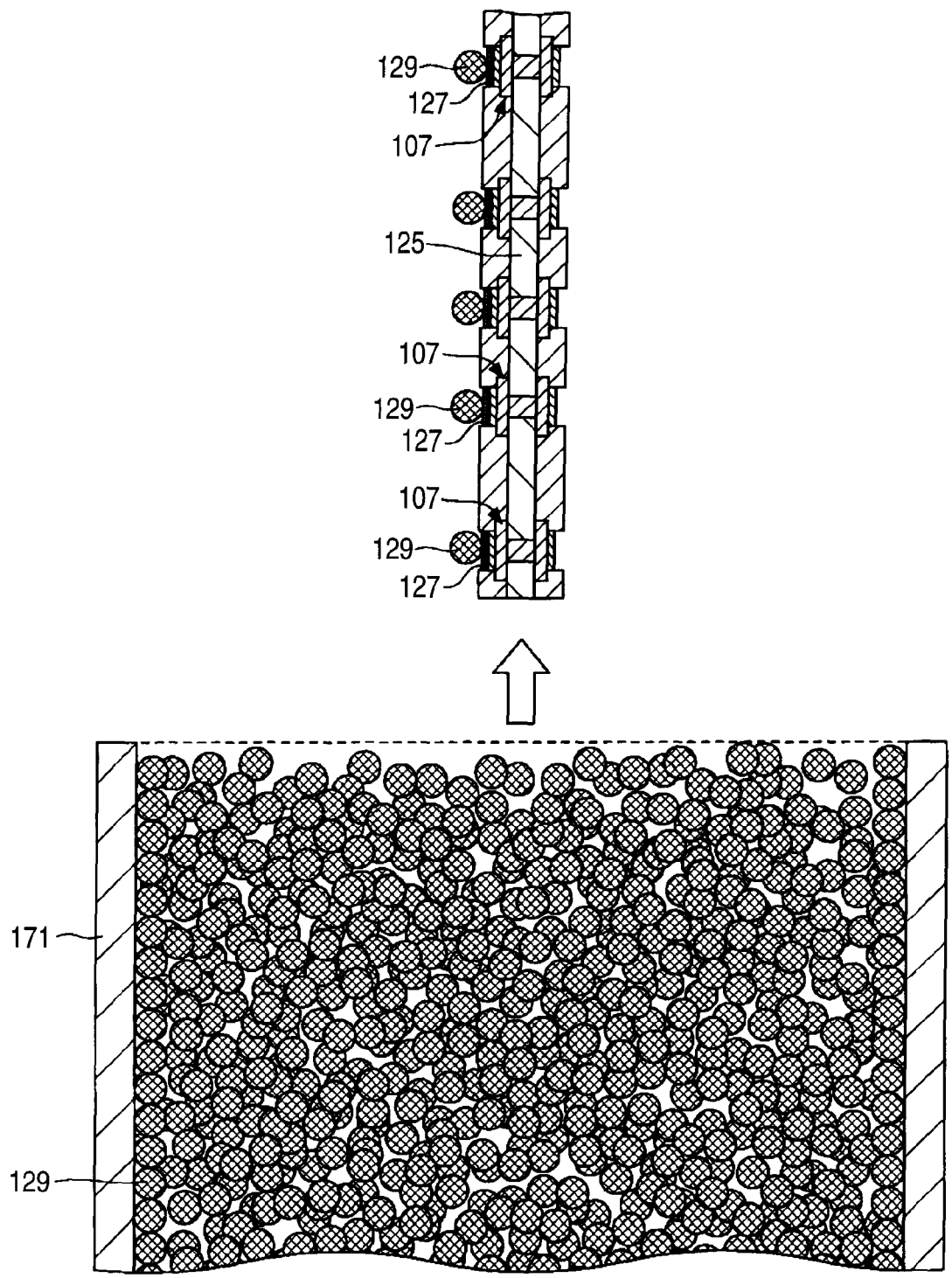
FIG. 34 is a view (No. 2) for explaining another conductive ball mounting method.
Figure 35:
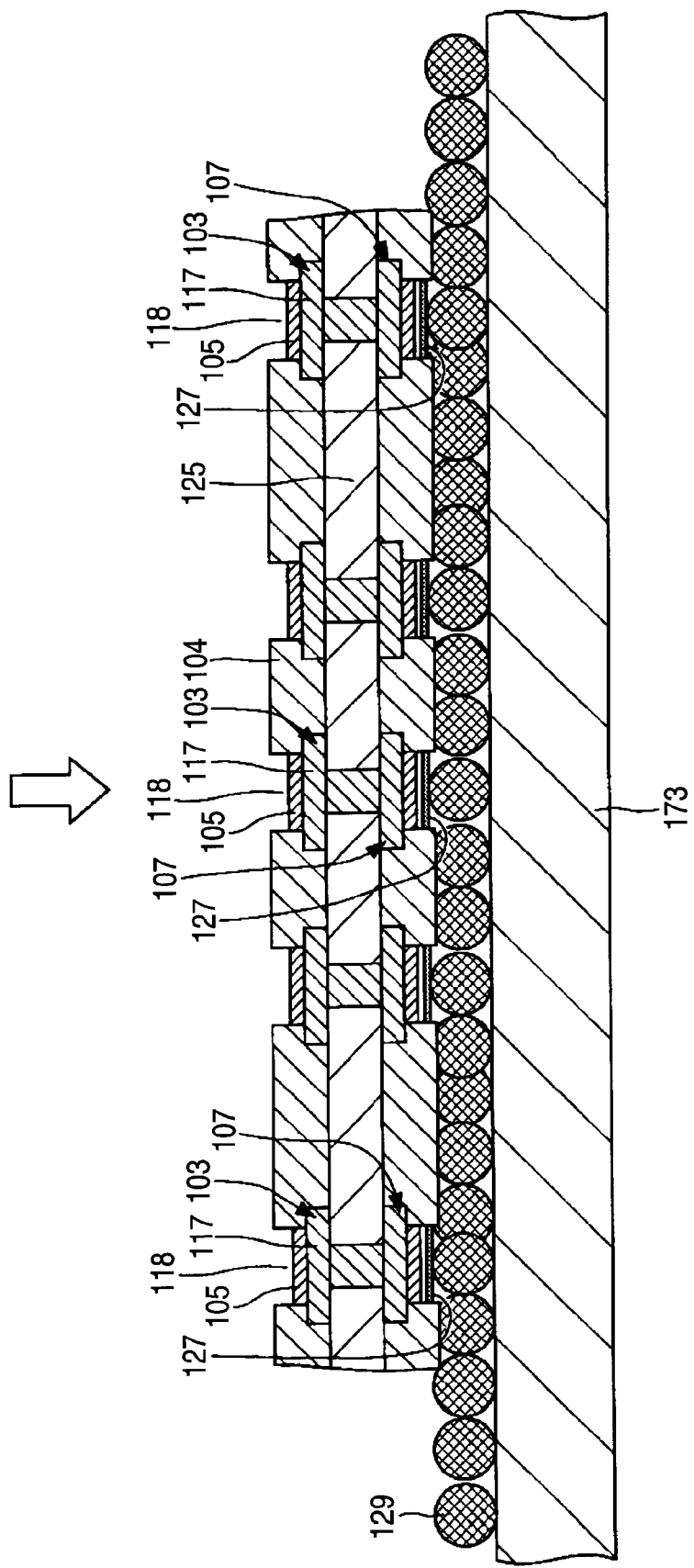
FIG. 35 is a view (No. 1) for explaining a further conductive ball mounting method.
Figure 36:
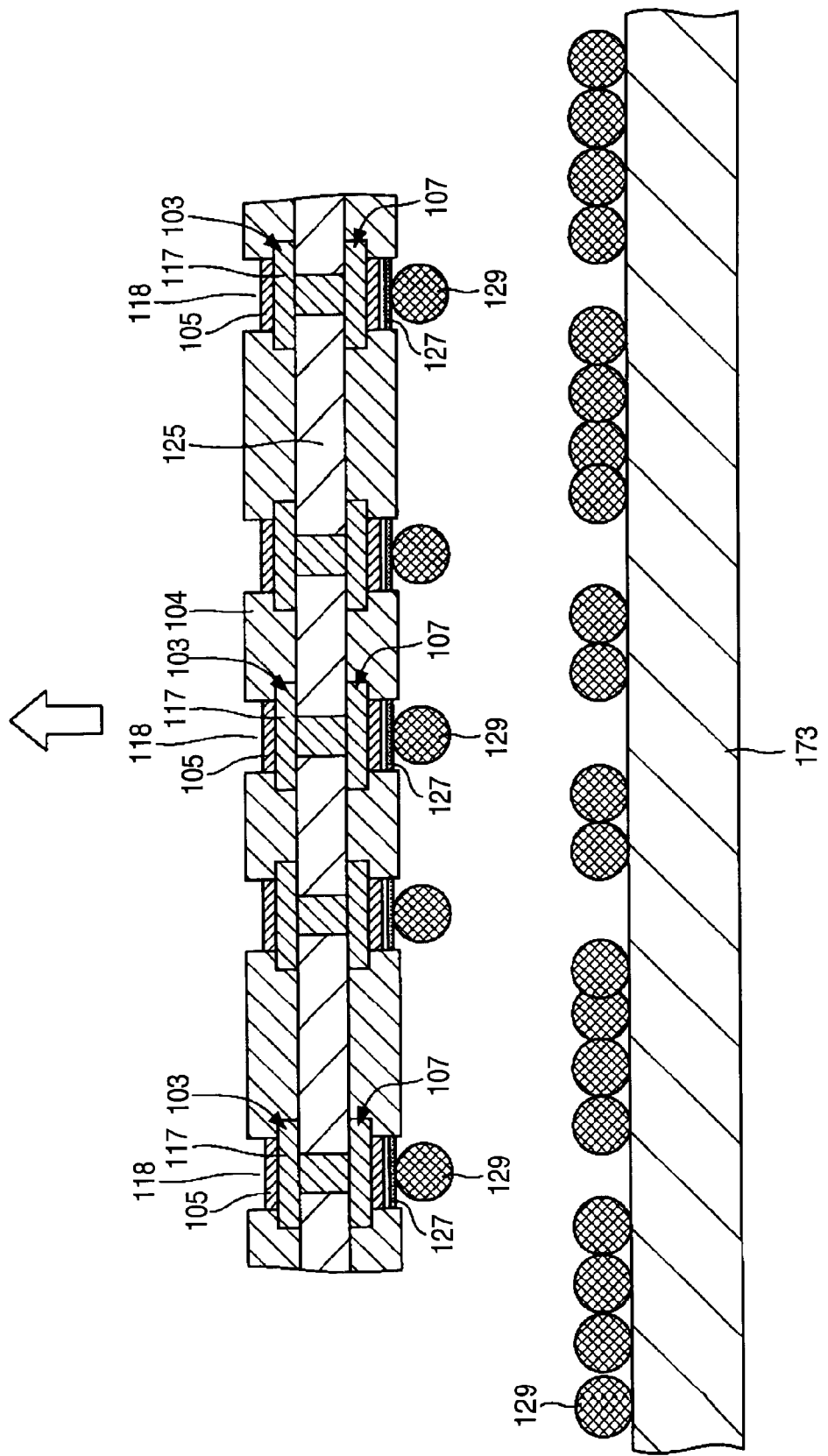
FIG. 36 is a view (No. 2) for explaining the further conductive ball mounting method.
Figure 37:
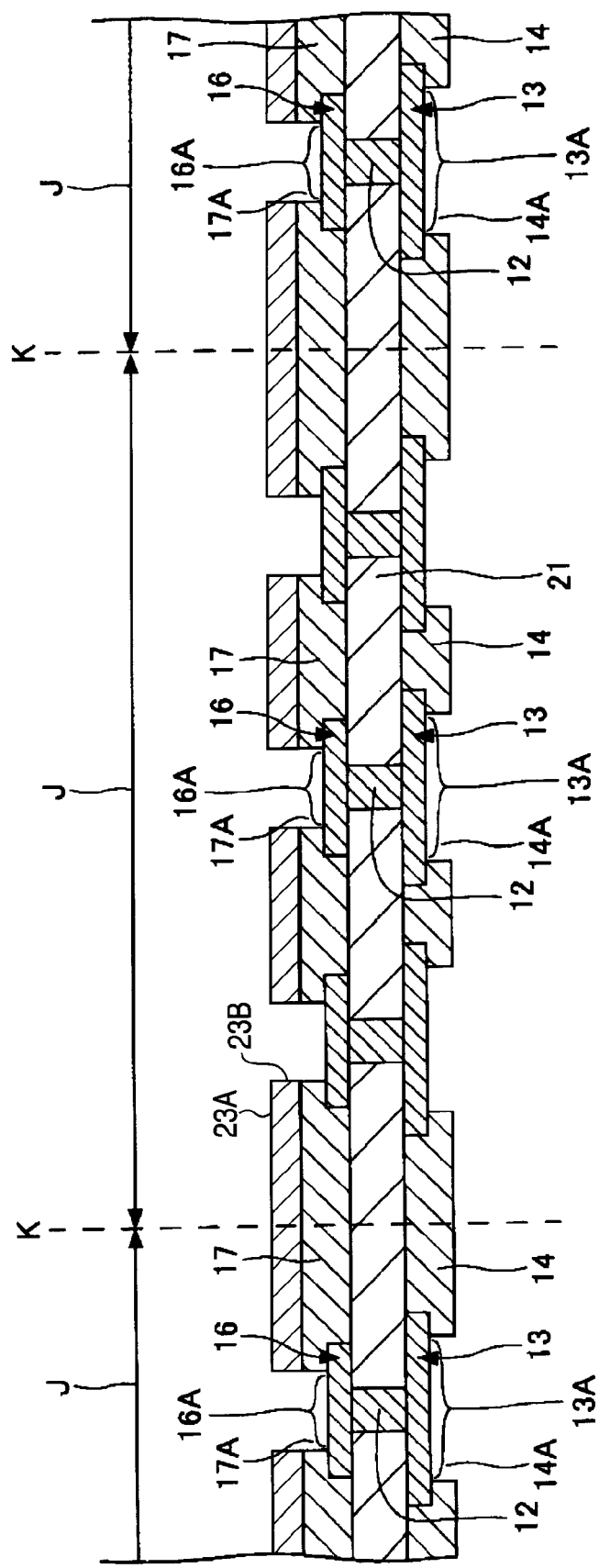
FIG. 37 is a view for explaining a problem of a related-art solder bump forming method.

FIGS. 33 and 34 are views for explaining another conductive ball mounting method and FIGS. 35 and 36 are views for explaining a further conductive ball mounting method.

As shown in FIGS. 33 and 34, it is also possible to insert the structure shown in FIGS. 14 or 28 into a conductive ball housing 171 accommodating the conductive balls 129 and to then pull out the structure thus inserted, thereby bonding the conductive balls 129 to the organic sticking layers 127 and 155.

As shown in FIGS. 35 and 36, moreover, it is also possible to press the structure shown in FIG. 14 or 28 against a plate 173 having the conductive balls 129 mounted thereon, thereby bonding the conductive balls 129 to the organic sticking layers 127 and 155 and thus mounting the conductive balls 129 thereon.

The invention can be applied to a solder bump forming method of mounting a conductive ball on each of pads provided on a wiring board, a package such as a chip size package, or a substrate such as a semiconductor chip to form a solder ball.

What is claimed is:

1. A method of forming a solder bump, comprising:
    forming a metal film capable of chemically reacting to a tackifying compound on a plurality of pads;
    forming an organic sticking layer by causing a solution containing the tackifying compound to chemically react to the metal film, thereby forming an organic sticking layer on the metal film;
    supplying a conductive ball on the organic sticking layer, thereby mounting the conductive ball on the pads through the organic sticking layer and the metal film; and
    carrying out a reflow treatment over the conductive ball mounted on the plurality of pads.

2. The method of forming a solder bump according to claim 1, wherein the tackifying compound contains at least one of a naphthotriazole based derivative, a benzotriazole based derivative, an imidazole based derivative, a benzoimidazole based derivative, a mercaptobenzothiazole based derivative and a benzothiazolethio fatty acid based derivative.

3. The method of forming a solder bump according to claim 1, wherein the metal film is a Cu film or an Ni film.

4. The method of forming a solder bump according to claim 3, wherein when the Ni film is used as the metal film, said method further comprises:
    forming an Au layer on the metal film; and
    removing the Au layer immediately before the organic sticking layer forming step between the metal film forming step and the organic sticking layer forming step.

5. The method of forming a solder bump according to claim 1, wherein at the conductive ball mounting step, the conductive balls are distributed over the pads having the organic sticking layer formed thereon and the pads are oscillated or rocked to mount one of the conductive balls on each of the pads.

6. The method of forming a solder bump according to claim 1, further comprising:
    forming a diffusion preventing film on the pads before the metal film forming step,
    wherein the metal film is formed on the diffusion preventing film.

7. The method of forming a solder bump according to claim 6, wherein the diffusion preventing film is constituted by at least one of an Ni film, a Pd film and an Au film which are formed by a plating method.

* * * * *

UNITED STATES PATENT AND TRADEMARK OFFICE
CERTIFICATE OF CORRECTION

| | | |
|---|---|---|
| PATENT NO. | : 7,807,560 B2 | Page 1 of 1 |
| APPLICATION NO. | : 12/173985 | |
| DATED | : October 5, 2010 | |
| INVENTOR(S) | : Imafuji et al. | |

Figure 1:
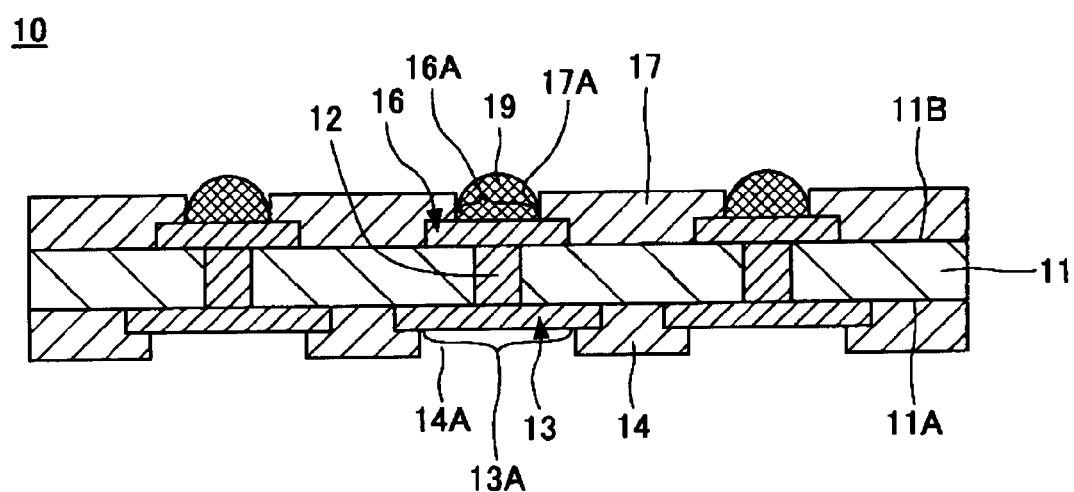
FIG. 1 is a sectional view showing a related-art substrate.

It is certified that error appears in the above-identified patent and that said Letters Patent is hereby corrected as shown below:

In Fig. 1, Sheet 1 of 37, delete "FIG. 1" and insert -- FIG. 1 (PRIOR ART) --

Figure 2:
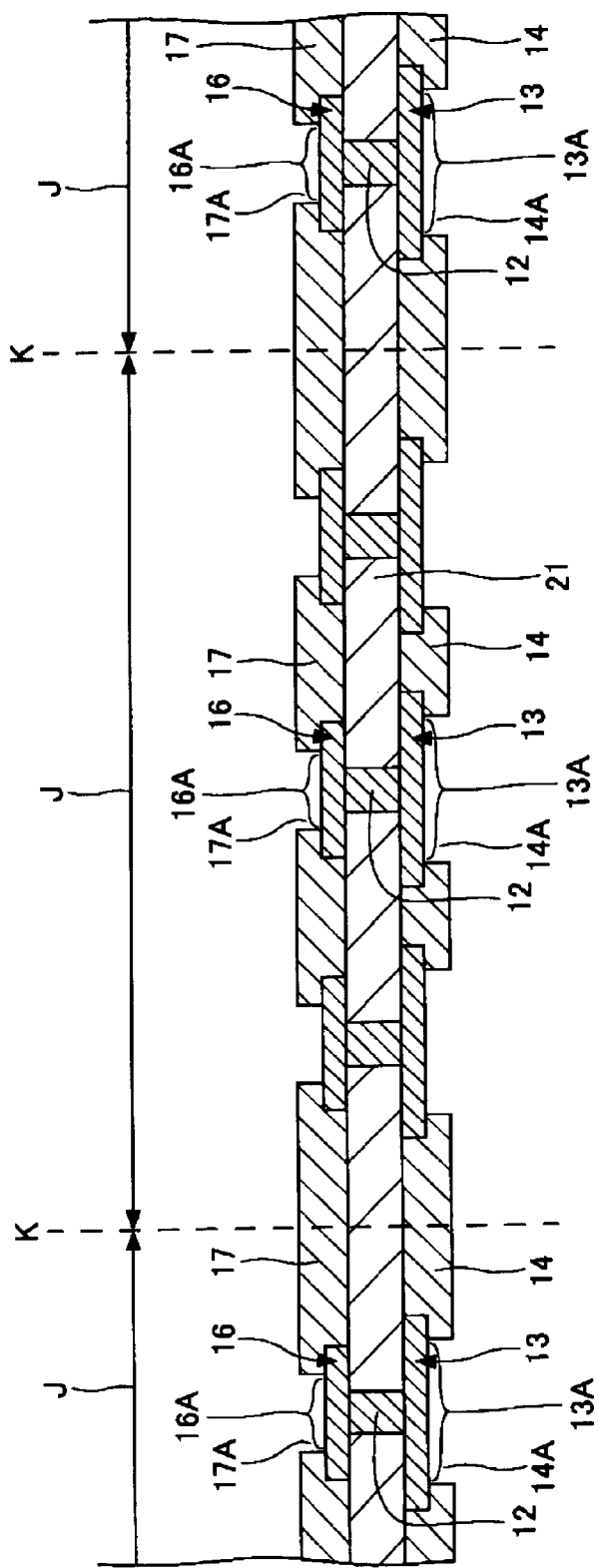
FIG. 2 is a view (No. 1) showing a related-art solder bump forming step.

In Fig. 2, Sheet 2 of 37, delete "FIG. 2" and insert -- FIG. 2 (PRIOR ART) --

Figure 3:
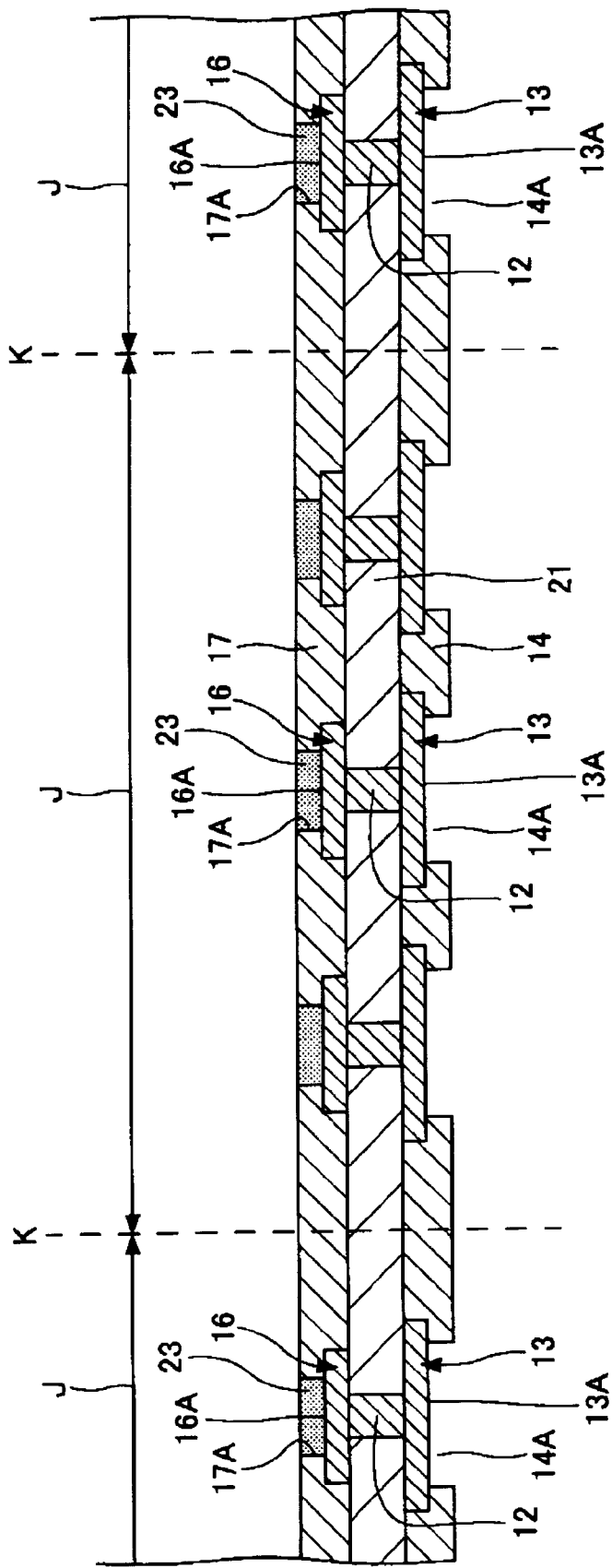
FIG. 3 is a view (No. 2) showing the related-art solder bump forming step.

In Fig. 3, Sheet 3 of 37, delete "FIG. 3" and insert -- FIG. 3 (PRIOR ART) --

Figure 4:
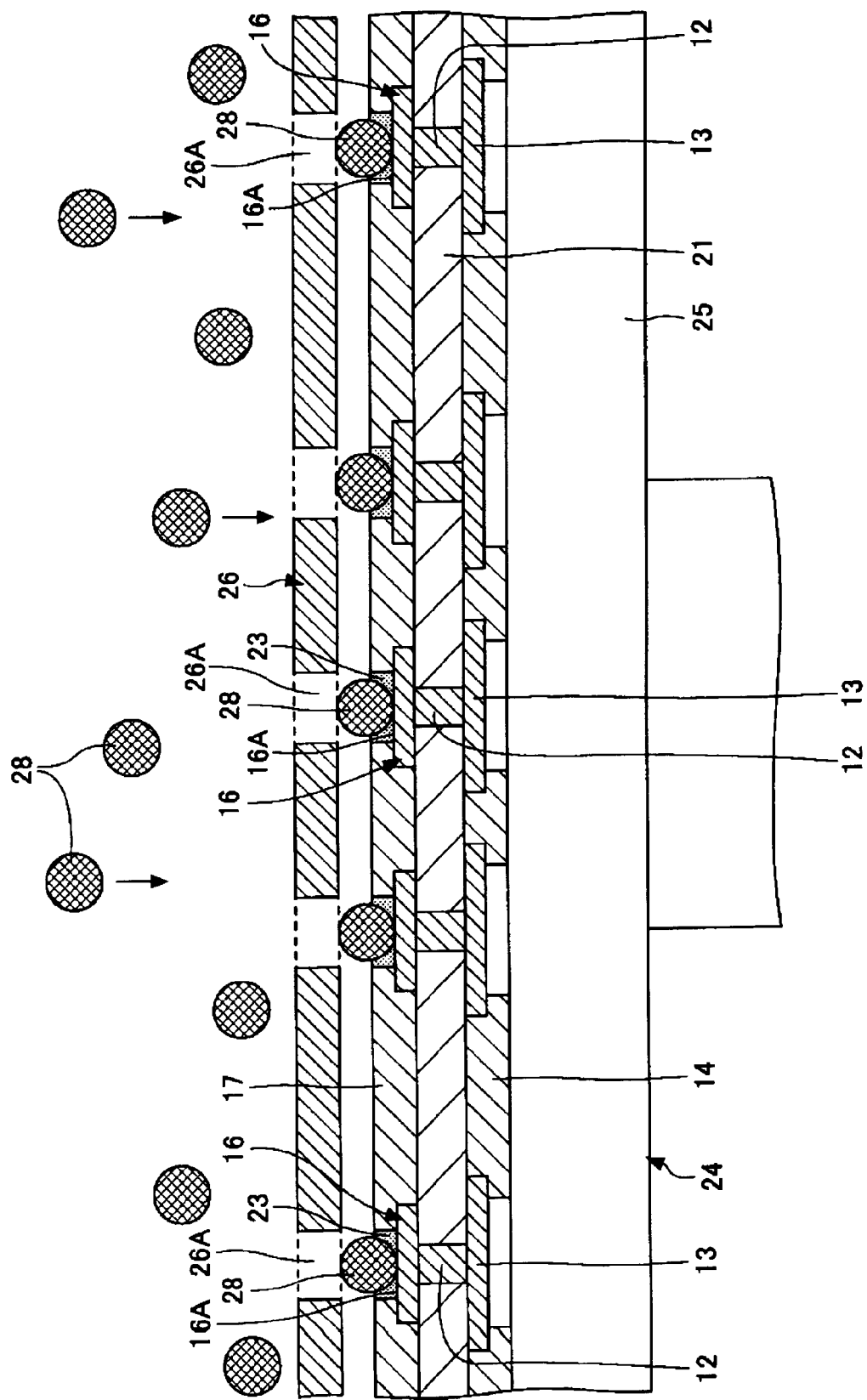
FIG. 4 is a view (No. 3) showing the related-art solder bump forming step.

In Fig. 4, Sheet 4 of 37, delete "FIG. 4" and insert -- FIG. 4 (PRIOR ART) --

Figure 5:
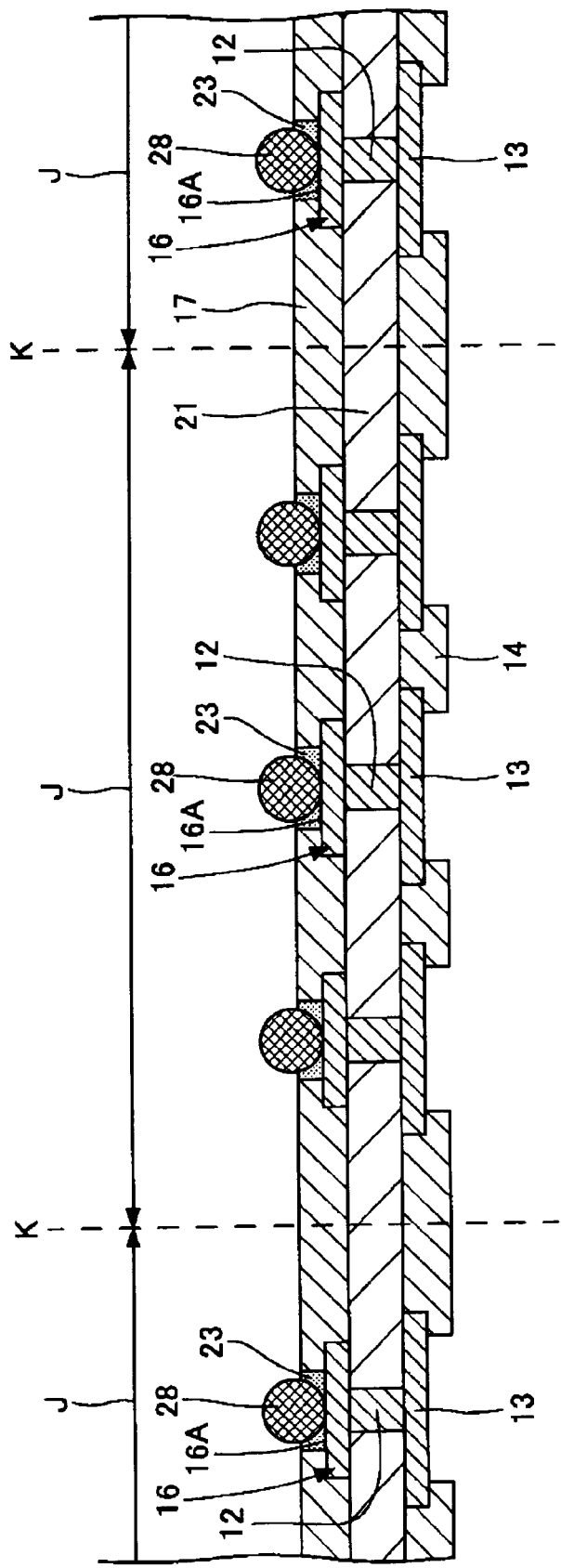
FIG. 5 is a view (No. 4) showing the related-art solder bump forming step.

In Fig. 5, Sheet 5 of 37, delete "FIG. 5" and insert -- FIG. 5 (PRIOR ART) --

Figure 6:
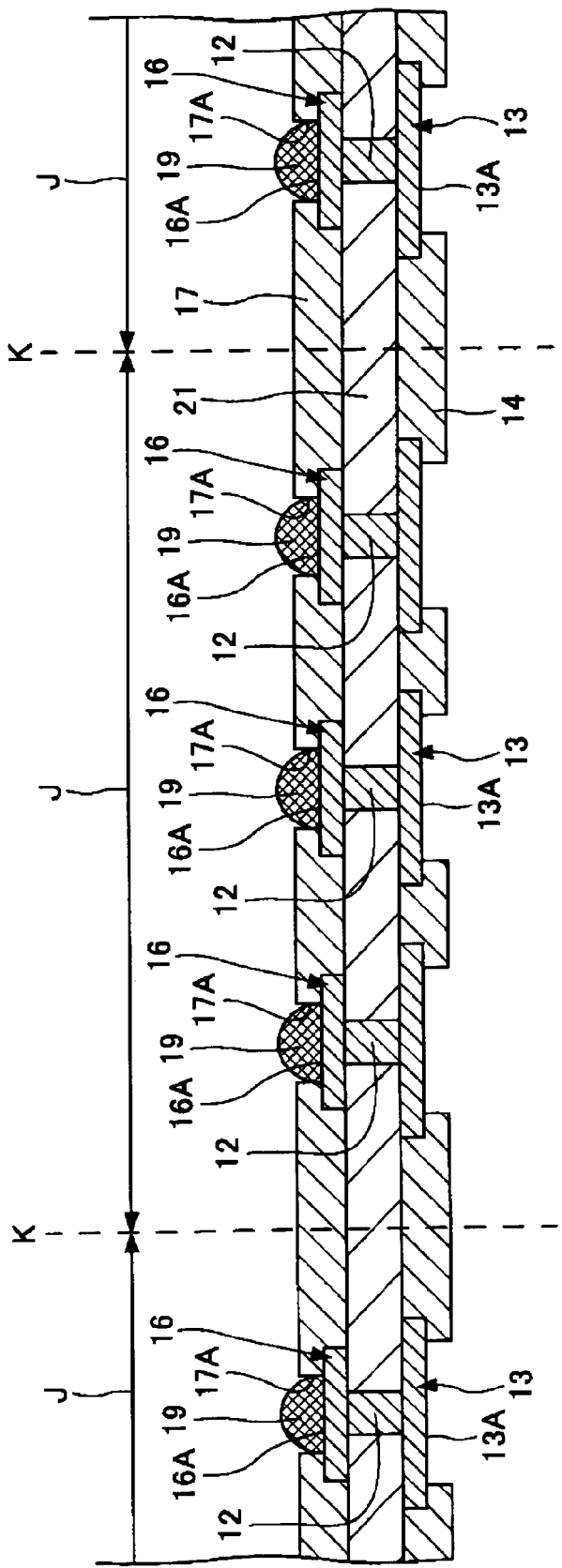
FIG. 6 is a view (No. 5) showing the related-art solder bump forming step.

In Fig. 6, Sheet 6 of 37, delete "FIG. 6" and insert -- FIG. 6 (PRIOR ART) --

Figure 7:
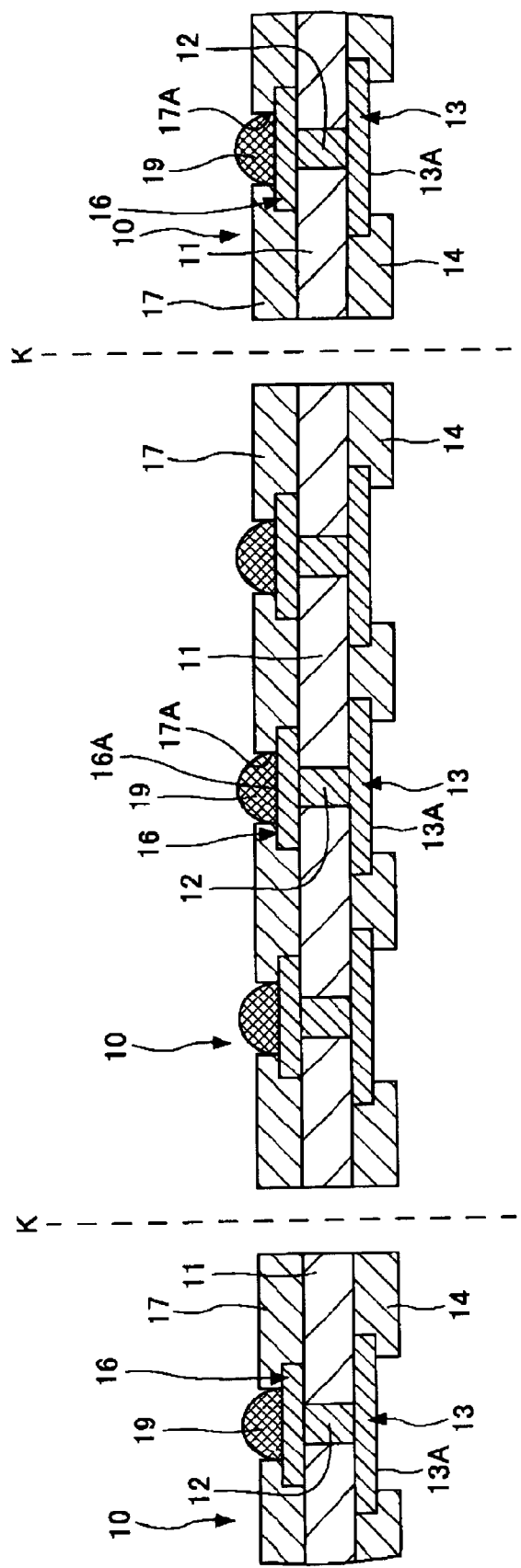
FIG. 7 is a view (No. 6) showing the related-art solder bump forming step.

In Fig. 7, Sheet 7 of 37, delete "FIG. 7" and insert -- FIG. 7 (PRIOR ART) --

Figure 8:
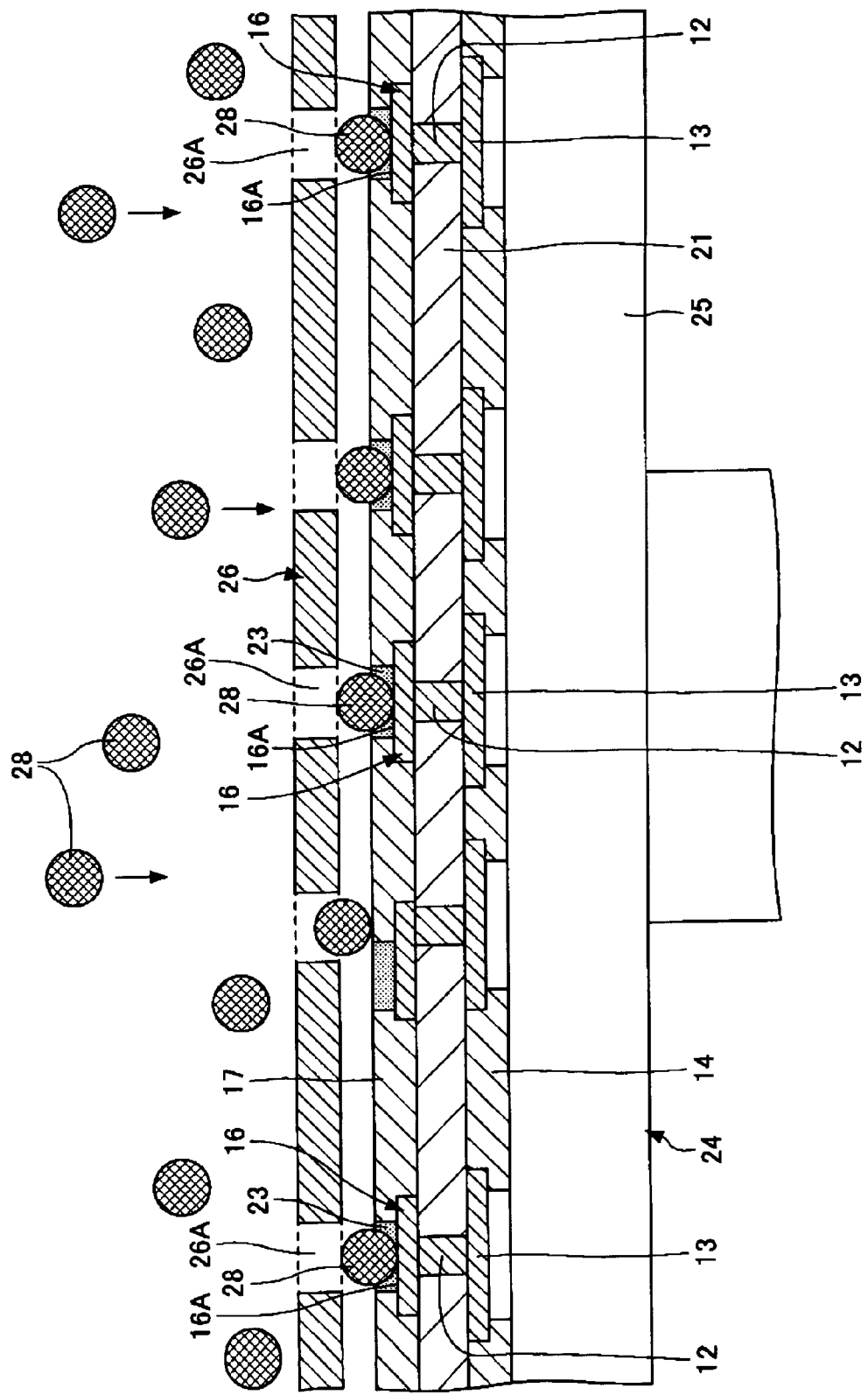
FIG. 8 is a view for explaining a problem of a related-art solder bump forming method.

In Fig. 8, Sheet 8 of 37, delete "FIG. 8" and insert -- FIG. 8 (PRIOR ART) --

Signed and Sealed this
First Day of February, 2011

David J. Kappos
*Director of the United States Patent and Trademark Office*